United States Patent
Patel et al.

(10) Patent No.: US 6,512,555 B1
(45) Date of Patent: Jan. 28, 2003

(54) RADIO RECEIVER FOR VESTIGAL-SIDEBAND AMPLITUDE-MODULATION DIGITAL TELEVISION SIGNALS

(75) Inventors: Chandrakant B. Patel, Hopewell, NJ (US); Allen LeRoy Limberg, Vienna, VA (US)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/375,235

(22) Filed: Aug. 16, 1999

Related U.S. Application Data

(63) Continuation-in-part of application No. 09/294,304, filed on Apr. 14, 1999, which is a continuation-in-part of application No. 09/217,634, filed on Dec. 22, 1998, which is a continuation-in-part of application No. 08/785,227, filed on Jan. 17, 1997, now abandoned, which is a continuation-in-part of application No. 08/266,753, filed on Jun. 28, 1994, now Pat. No. 6,104,442, and a continuation-in-part of application No. 08/825,710, filed on Mar. 19, 1997, and a continuation-in-part of application No. 08/573,454, filed on Dec. 15, 1995, now Pat. No. 5,636,252, and a continuation-in-part of application No. 08/237,896, filed on May 4, 1994, now Pat. No. 5,479,449, and a continuation-in-part of application No. 08/773,949, filed on Dec. 26, 1996.

(51) Int. Cl.$^7$ .............................................. H04N 5/455

(52) U.S. Cl. ...................... 348/726; 348/731; 348/729; 348/725; 348/500; 348/737; 375/319

(58) Field of Search .......................... 348/726, 426.1, 348/558, 725, 731, 729, 728, 727, 423.1, 500, 555, 554, 720; 455/32; 375/319; H04N 5/46

(56) References Cited

U.S. PATENT DOCUMENTS

| | | | | |
|---|---|---|---|---|
| 5,268,761 A | * | 12/1993 | White | 348/678 |
| 5,375,146 A | * | 12/1994 | Chalmers | 375/344 |
| 5,410,368 A | * | 4/1995 | Krishnamurthy et al. | 348/505 |
| 5,487,186 A | * | 1/1996 | Scarpa | 375/344 |
| 5,495,203 A | * | 2/1996 | Harp et al. | 329/306 |
| 5,506,636 A | * | 4/1996 | Patel et al. | 348/725 |
| 5,528,633 A | * | 6/1996 | Halik et al. | 329/307 |
| 5,546,138 A | * | 8/1996 | Krishnamurthy et al. | 348/536 |
| 5,588,025 A | * | 12/1996 | Strolle et al. | 375/316 |
| 5,606,579 A | * | 2/1997 | Patel et al. | 348/725 |
| 5,608,764 A | * | 3/1997 | Sugita et al. | 375/260 |
| 5,612,975 A | * | 3/1997 | Becker et al. | 329/308 |
| 5,638,140 A | * | 6/1997 | Krishnamurthy et al. | 331/34 |
| 5,648,987 A | * | 7/1997 | Yang et al. | 348/607 |

(List continued on next page.)

*Primary Examiner*—John Miller
*Assistant Examiner*—Linus H. Lo
(74) *Attorney, Agent, or Firm*—Sughrue Mion, PLLC

(57) ABSTRACT

Apparatus for reproducing data from a selected digital television signal, transmitted in packet form as vestigial-sideband (VSB) amplitude-modulation (AM) of a carrier, has a tuner for selecting a digital television signal and converting it to a final intermediate-frequency signal, which is digitized by an analog-to-digital converter before synchrodyning to baseband in the digital regime. VSB synchrodyning circuitry synchrodynes the digitized final intermediate-frequency signal to baseband in the digital regime to generate in-phase and quadrature-phase baseband signals. The quadrature-phase baseband signal is lowpass filtered to generate an automatic frequency and phase control (AFPC) signal for controlling a local oscillator in the tuner, so that the in-phase baseband signal comprises digitized VSB symbol coding. Symbol decoding circuitry responsive to the VSB symbol coding generates a digital data stream. Data synchronization recovery circuitry recovers data synchronizing information included in the digital data stream. A video decoder of decompression type, such as an MPEG-2 video decoder responsive to portions of the digital data stream, as selected in response to the data synchronizing information, generates digital signals descriptive of red, green and blue video signals.

34 Claims, 12 Drawing Sheets

U.S. PATENT DOCUMENTS

| | | | |
|---|---|---|---|
| 5,724,396 A | * | 3/1998 | Claydon et al. ............. 375/355 |
| 5,787,123 A | * | 7/1998 | Okada et al. ................ 370/203 |
| 5,793,818 A | * | 8/1998 | Claydon et al. ............. 375/326 |
| 5,841,814 A | * | 11/1998 | Cupo .......................... 329/304 |
| 5,956,328 A | * | 9/1999 | Sato ........................... 370/204 |
| 6,067,329 A | * | 5/2000 | Kato et al. ................... 329/304 |
| 6,104,442 A | * | 8/2000 | Patel et al. .................. 348/725 |
| 6,184,921 B1 | * | 2/2001 | Limberg ................... 348/14.06 |
| 6,304,621 B1 | * | 10/2001 | Samueli et al. ............. 375/350 |

* cited by examiner

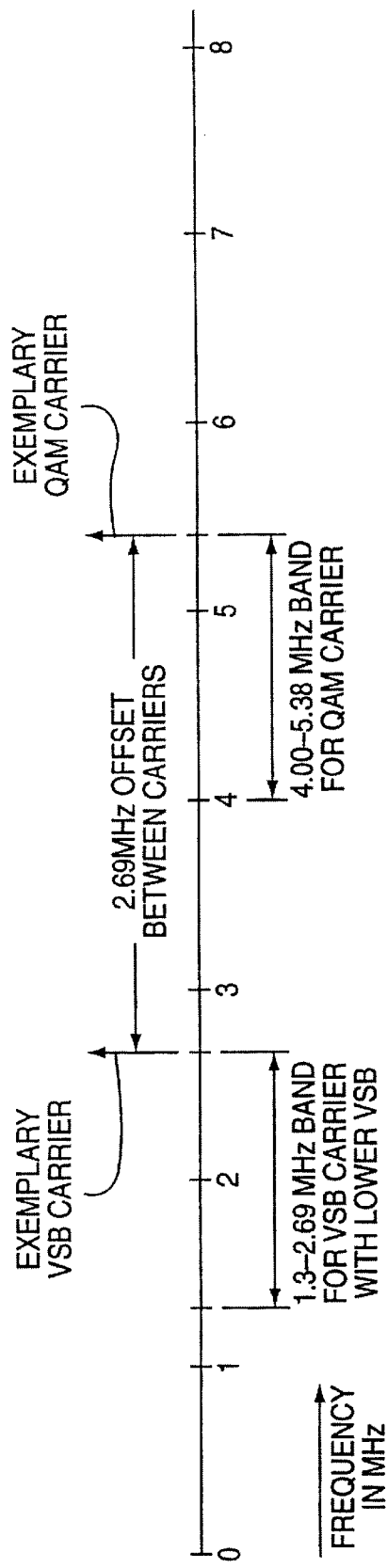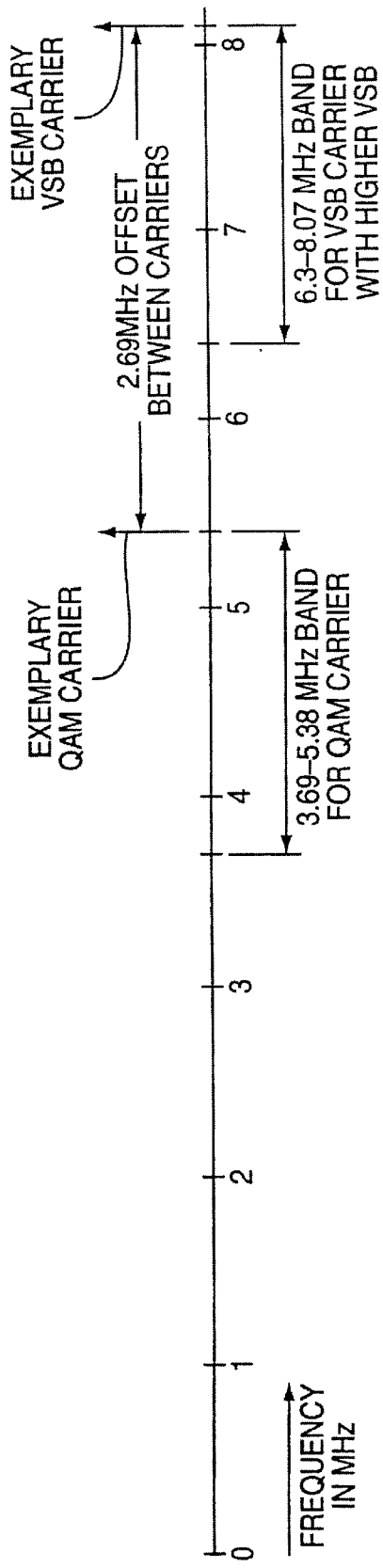

RADIO RECEIVER FOR VESTIGAL-SIDEBAND AMPLITUDE-MODULATION DIGITAL TELEVISION SIGNALS

This is a continuation-in-part of U.S. patent application Ser. No. 09/294,304 filed Apr. 14, 1999 as a continuation-in-part of U.S. patent application Ser. No. 09/217,634 filed Dec. 22, 1998 as a continuation-in-part of U.S. patent application Ser. No. 08/785,227 filed Jan. 17, 1997 now ABN as a continuation-in-part of U.S. patent application Ser. No. 08/266,753 filed Jun. 28, 1994; now U.S. Pat. No. 6,104,442 of U.S. patent application Ser. No. 08/825,710 filed Mar. 19, 1997 as a continuation-in-part of allowed U.S. patent application Ser. No. 08/266,753 filed Jun. 28, 1994; of U.S. patent application Ser. No. 08/573,454 issued Jun. 3, 1977 as U.S. Pat. No. 5,636,252 and filed Dec. 15, 1995 as a continuation-in-part of U.S. patent application Ser. No. 08/237,896 issued Dec. 26, 1995 as U.S. Pat. No. 5,479,449 and filed May 4, 1994; and of U.S. patent application Ser. No. 08/773,949 filed Dec. 26, 1996 as a continuation-in-part of U.S. patent application Ser. No. 08/266,753 filed Jun. 28, 1994.

The invention relates to radio receivers having the capability of receiving digital signal transmissions, such as standard-definition digital television (DTV) signals or digital high-definition television (HDTV) signals, especially when vestigial-sideband (VSB) amplitude modulation (AM) of a radio-frequency (R-F) carrier by multi-level symbol coding is employed for transmitting the digital information.

BACKGROUND OF THE INVENTION

In DTV radio receivers and similar receiver apparatus for receiving a carrier amplitude-modulated by multi-level symbol code sequences, demodulation has been done in the analog regime to reproduce the multi-level symbol code sequences at baseband, with the demodulation results subsequently being digitized. This generates a digitized baseband signal suitable for baseband equalization and for data slicing. A DTV radio receiver according to such design was used by the Grand Alliance, a group of DTV proponents including Zenith Electronics Corporation, during the development of the broadcast DTV standard published by the Advanced Television Systems Committee (ATSC) in September 1995. This standard is approved by the Federal Communications Commission (FCC) for use in terrestrial broadcasting in the United States of America.

Alternatively, radio receivers can be constructed in which an intermediate-frequency (I-F) amplitude-modulation (AM) signal developed by downconversion of a received radio-frequency AM signal is digitized and is then demodulated by synchrodyning in the digital regime. It is preferable that the digitized I-F signal be supplied as a complex signal having real and imaginary portions. These real and imaginary portions can be synchronously detected using respective orthogonal phases of a digital carrier, with these component synchronous detection results being digitally subtracted or digitally added, depending how the orthogonal phases of the digital carrier are chosen, to recover an in-phase demodulation result at baseband. These real and imaginary portions can also be synchronously detected using respective orthogonal phases of a digital carrier, with these component synchronous detection results being digitally added or digitally subtracted, depending how the orthogonal phases of the digital carrier are chosen, to recover a quadrature-phase demodulation result at baseband. In accordance with a prior art procedure, the in-phase demodulation result is developed by subtraction, and the quadrature-phase demodulation result is developed by addition. In the applications from which priority is claimed, as in this specification and its accompanying drawing, the in-phase demodulation result is developed by addition; and the quadrature-phase demodulation result is developed by subtraction.

A number of different procedures can be used for supplying the digitized I-F signal as a complex signal having real and imaginary portions. The downconversion of analog DTV signals to the final I-F band can be done using a complex mixing operation involving local oscillations supplied in two orthogonal phasings, with the analog real and imaginary components of the complex mixer output signal being digitized by respective analog-to-digital converters. To avoid the problem of two analog-to-digital converters having somewhat different conversion characteristics, the analog real and imaginary components of the complex mixer output signal can instead be digitized by a single analog-to-digital converter operated on a duplex basis. The inventors believe that approaches to supplying the digitized I-F signal as a complex signal that avoid the need for the complex mixer are more practical. The analog downconverted DTV signal is digitized before being phase-split into real and imaginary components of a complex digital final I-F signal.

The phase-splitter circuitry for supplying an imaginary portion as well as a real portion of a complex digitized final I-F signal can take a number of forms. The phase-splitter circuitry can comprise a Hilbert transform filter, for supplying the imaginary portion of said complex digitized final I-F signal in response to the digitized final I-F signal supplied from the analog-to-digital converter (ADC), and delay circuitry for supplying the real portion of the complex digitized final I-F signal in delayed response to the digitized final I-F signal supplied from the ADC. Such an approach is described by D. W. Rice and K. H. Wu in their article "Quadrature Sampling with High Dynamic Range" on pp. 736–739 of *IEEE TRANSACTIONS ON AEROSPACE AND ELECTRONIC SYSTEMS*, Vol. AES-18, No. 4 (November 1982). Alternatively, the phase-splitter circuitry can use a pair of infinite-impulse-response (IIR) filters for providing real and imaginary responses to the digitized final I-F signal supplied from the ADC. C. M. Rader describes such a procedure in his article "A Simple Method for Sampling In-Phase and Quadrature Components", *IEEE TRANSACTIONS ON AEROSPACE AND ELECTRONIC SYSTEMS*, Vol. AES-20, No. 6 (November 1984), pp. 821–824. In yet another alternative, the phase-splitter circuitry can use a pair of finite-impulse-response (FIR) filters for providing real and imaginary responses to the digitized final I-F signal supplied from the ADC. T. F. S. Ng describes such a procedure in United Kingdom patent application 2 244 410 A published Nov. 27, 1991 and entitled QUADRATURE DEMODULATOR.

The orthogonal phases of digital carrier used in synchronous detection can be generated by digitizing carrier waves that are supplied in orthogonal phases from a beat-frequency oscillator (BFO) in the receiver. However, the orthogonal phases of digital carrier used in synchronous detection can be generated from look-up tables stored in read-only memory (ROM) addressed by an address derived from a counting of the samples in the complex digitized I-F signal. This latter arrangement is preferable, in that analog-to-digital conversion circuitry for the two phases of digital carrier can be avoided, and in that orthogonality of the two phases of digital carrier is better assured.

In the prior art, in order properly to synchrodyne the digitized final I-F signal to baseband for recovering in-phase and quadrature-phase demodulation results, the digital carrier is adjusted in frequency and phase to match the frequency and phase of the suppressed carrier of the digitized final I-F signal. It is difficult to implement the adjustment of the frequency of digital carrier supplied from ROM unless sample clock frequency is adjustable, which adjustment of sample clock frequency undesirably interferes with equalizer operation. The adjustment of digital carrier phase presents more subtle problems. When adjustment of digital carrier phase is attempted in the digital regime, the discontinuous nature of digital sampling limits the precision of such adjustments, the inventors point out. These adjustments can be made more precisely in the analog regime where signals are continuous in nature, rather than being sampled at recurrent intervals with attendant quantizing errors arising from digitization. When the orthogonal phases of digital carrier used in digital synchrodyning procedures are supplied from ROM, adjustments cannot be made in the analog regime insofar as the inventors are aware. So, cumbersome procedures for interpolation between digital carrier samples have been employed for refining the adjustment of the frequency and phase of the digital carrier.

The inventors have discerned how to avoid these problems, which are particularly difficult to solve when the orthogonal phases of digital carrier used in digital synchrodyning procedures are supplied from ROM. Rather than just adjusting the frequency and phase of the digital carrier to match the frequency and phase of the suppressed carrier of the digitized final I-F signal, the frequency and phase of the digitized final I-F signal as referred to its suppressed carrier are adjusted. This adjustment can be implemented in the analog regime, using automatic-frequency-and-phase-control (AFPC) of a local oscillator used in the analog downconversion of received DTV signal to the final I-F band.

SUMMARY OF THE INVENTION

The invention is embodied in receiver apparatus for reproducing data transmitted by amplitude-modulation of a carrier by multi-level symbol code sequences, which transmission may be in a selected one of the 6-MHz-wide channels of the electromagnetic frequency spectrum that are used for television broadcasting, for example. The receiver apparatus has a tuner for selecting the carrier amplitude-modulated by multi-level symbol code sequences and converting the frequencies thereof to generate a final intermediate-frequency signal. A local oscillator is included in the tuner for supplying local oscillations used in converting the frequencies of the amplitude-modulated carrier. The frequency and phase of these local oscillations are controlled in response to an automatic-frequency-and-phase-control (AFPC) signal applied to the local oscillator. A sample clock generator apparatus for generating sample clock signals is included in the receiver together with an analog-to-digital converter for digitizing samples of the final intermediate-frequency signal, which samples are taken in response to the sample clock signals. Accordingly, the analog-to-digital converter is arranged for generating samples of digitized final intermediate-frequency signal. Digital synchrodyning circuitry included in the receiver apparatus responds to the digitized final intermediate-frequency signal for generating a digital in-phase baseband signal and a digital quadrature-phase baseband signal, by synchrodyning the digitized final intermediate-frequency signal to baseband in the digital regime. The receiver apparatus includes circuitry for generating a lowpass filter response to the digital quadrature-phase baseband signal. This lowpass filter response is applied to the local oscillator as AFPC signal, to complete an AFPC feedback loop that adjusts the local oscillations, so that the carrier frequency and phase of the final intermediate-frequency signal corresponds with the frequency and phase of the digital carrier used by the digital synchrodyning circuitry in its synchronous detection procedures. This causes the digital in-phase baseband signal to be descriptive of transmitted multi-level symbol code. Symbol decoding circuitry is arranged in the receiver apparatus to respond to the multi-level symbol code sequences as reproduced in the digital in-phase baseband signal, for reproducing the transmitted data.

BRIEF DESCRIPTION OF THE DRAWING

FIG. 11 is a graph of the constraints on the final intermediate frequencies to which the carriers of a QAM DTV signal and a VSB DTV signal can be frequency translated, when the carrier of a VSB DTV signal is lower in frequency than the carrier of a QAM DTV signal in the final IF signal, so the full sideband of the VSB DTV signal is higher in frequency than its vestigial sideband in the final IF signal, and when the sample rate during digitization is constrained to $21.52 * 10^6$ samples per second.

FIG. 12 is a graph of the constraints on the final intermediate frequencies to which the carriers of a QAM DTV signal and a VSB DTV signal can be frequency translated, when the carrier of a VSB DTV signal is higher in frequency than the carrier of a QAM DTV signal in the final IF signal, so the full sideband of the VSB DTV signal is lower in frequency than its vestigial sideband in the final IF signal, and when the sample rate during digitization is constrained to $21.52 * 10^6$ samples per second.

Figure 1:
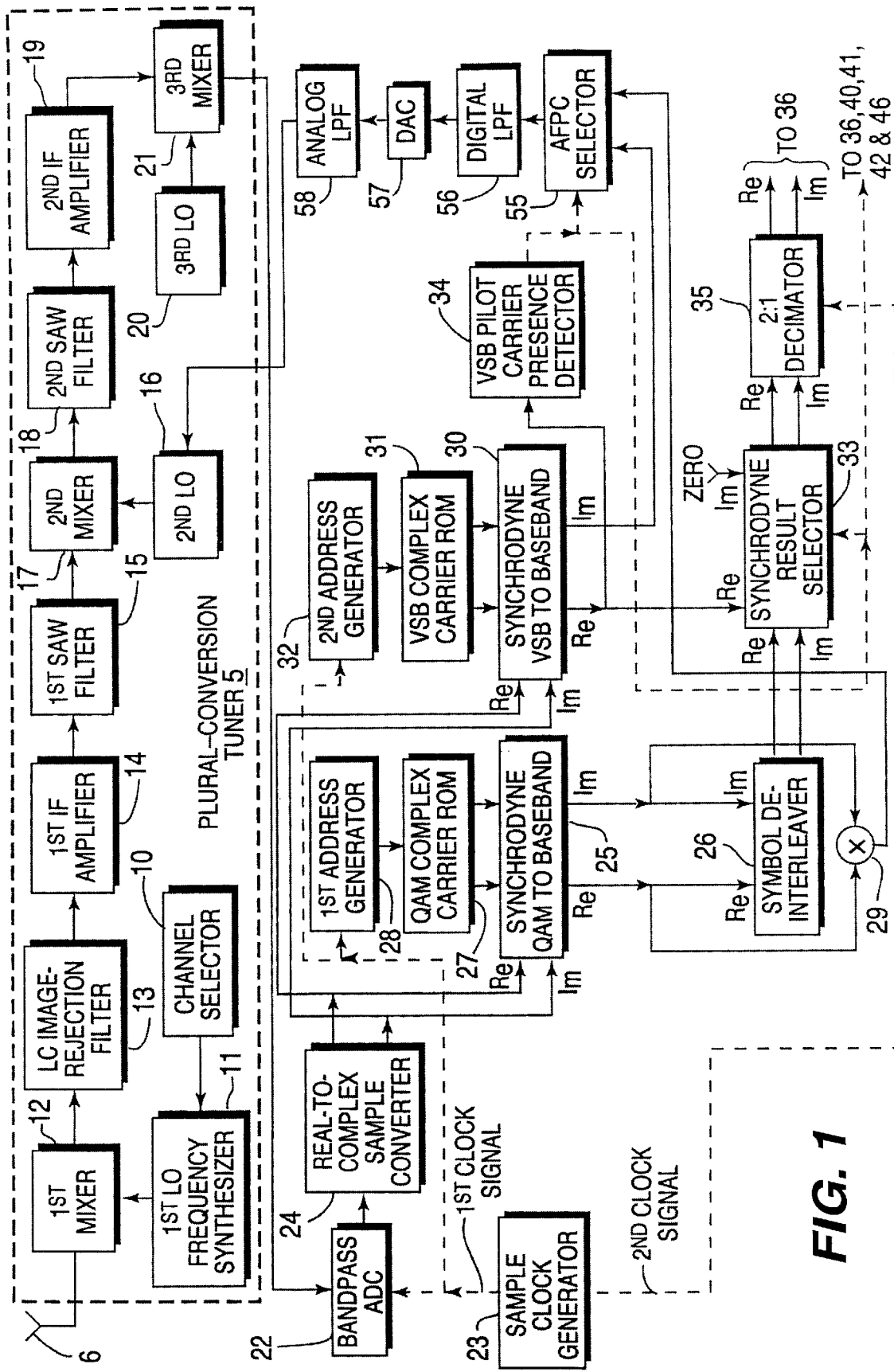
FIG. 1 is a block schematic diagram of initial portions of a digital television (DTV) signal radio receiver of a type that embodies the invention.

In the block schematic diagrams, clock or control signal connections are shown in dashed line, where it is desired to distinguish them from connections for the signals being controlled. To avoid over-complexity in the block schematic diagrams, some shimming delays necessary in the digital circuitry are omitted, where a need for such shimming delay is normally taken into account by a circuit or system designer.

DETAILED DESCRIPTION

A Digital Television Standard published Sep. 16, 1995 by the Advanced Television Subcommittee (ATSC) specifies vestigial sideband (VSB) signals for transmitting digital television (DTV) signals in 6-MHz-bandwidth television channels such as those currently used in over-the-air broadcasting of National Television Systems Committee (NTSC) analog television signals within the United States. The VSB DTV signal is designed so its spectrum is likely to interleave with the spectrum of a co-channel interfering NTSC analog TV signal. This is done by positioning the pilot carrier and the principal amplitude-modulation sideband frequencies of the DTV signal at odd multiples of one-quarter the horizontal scan line rate of the NTSC analog TV signal that fall between the even multiples of one-quarter the horizontal scan line rate of the NTSC analog TV signal, at which even multiples most of the energy of the luminance and chrominance components of a co-channel interfering NTSC analog TV signal will fall. The video carrier of an NTSC analog TV signal is offset 1.25 MHz from the lower limit frequency of the television channel. The carrier of the DTV signal is offset from such video carrier by 59.75 times the horizontal scan line rate of the NTSC analog TV signal, to place the carrier of the DTV signal about 309,877.97 Hz from the lower limit frequency of the television channel. Accordingly, the carrier of the DTV signal is about 2,690,122.4 Hz from the middle frequency of the television channel. The exact symbol rate in the Digital Television Standard is (684/286) times the 4.5 MHz sound carrier offset from video carrier in an NTSC analog TV signal. The number of symbols per horizontal scan line in an NTSC analog TV signal is 684, and 286 is the factor by which horizontal scan line rate in an NTSC analog TV signal is multiplied to obtain the 4.5 MHz sound carrier offset from video carrier in an NTSC analog TV signal. The symbol rate is 10.762238 megasymbols per second, which can be contained in a VSB signal extending 5.381119 MHz from DTV signal carrier. That is, the VSB signal can be limited to a band extending 5.690997 MHz from the lower limit frequency of the television channel.

The ATSC standard for digital HDTV signal terrestrial broadcasting in the United States of America is capable of transmitting either of two high-definition television (HDTV) formats with 16:9 aspect ratio. One HDTV format uses 1920 samples per scan line and 1080 active horizontal scan lines per 30 Hz frame with 2:1 field interlace. The other HDTV format uses 1280 luminance samples per scan line and 720 progressively scanned scan lines of television image per 60 Hz frame. The ATSC standard also accommodates the transmission of DTV formats other than HDTV formats, such as the parallel transmission of four television signals having normal definition in comparison to an NTSC analog television signal.

DTV transmitted by vestigial-sideband (VSB) amplitude modulation (AM) during terrestrial broadcasting in the United States of America comprises a succession of consecutive-in-time data fields each containing 313 consecutive-in-time data segments. There are 832 symbols per data segment. So, with the symbol rate being 10.76 MHz, each data segment is of 77.3 microseconds duration. Each segment of data begins with a line synchronization code group of four symbols having successive values of +S, –S, –S and +S. The value +S is one level below the maximum positive data excursion, and the value –S is one level above the maximum negative data excursion. The initial line of each data field includes a field synchronization code group that codes a training signal for channel-equalization and multipath suppression procedures. The training signal is a 511-sample pseudo-noise sequence (or "PN-sequence") followed by three 63-sample PN sequences. This training signal is transmitted in accordance with a first logic convention in the first line of each odd-numbered data field and in accordance with a second logic convention in the first line of each even-numbered data field, the first and second logic conventions being one's complementary respective to each other.

The data within data lines are trellis coded using twelve interleaved trellis codes, each a ⅔ rate trellis code with one uncoded bit. The interleaved trellis codes are subjected to Reed-Solomon forward error-correction coding. The Reed-Solomon coding results are transmitted as 8-level (3 bits/symbol) one-dimensional-constellation symbol coding for over-the-air transmission, which transmissions are made without symbol precoding separate from the trellis coding procedure. The Reed-Solomon coding results are transmitted as 16-level (4 bits/symbol) one-dimensional-constellation symbol coding for cablecast, which transmissions are made without preceding. The VSB signals have their natural carrier wave, which would vary in amplitude depending on the percentage of modulation, suppressed.

The natural carrier wave is replaced by a pilot carrier wave of fixed amplitude, which amplitude corresponds to a prescribed percentage of modulation. This pilot carrier wave of fixed amplitude is generated by introducing a direct component shift into the modulating voltage applied to the balanced modulator generating the amplitude-modulation sidebands that are supplied to the filter supplying the VSB signal as its response. If the eight levels of 4-bit symbol coding have normalized values of –7, –5, –3, –1, +1, +3, +5 and +7 in the carrier modulating signal, the pilot carrier has a normalized vale of 1.25. The normalized value of +S is +5, and the normalized value of –S is –5.

VSB signals using 8-level symbol coding will be used in over-the-air broadcasting within the United States, and VSB signals using 16-level symbol coding can be used in over-the-air narrowcasting systems or in cable-casting systems. However, certain cable-casting is likely to be done using suppressed-carrier quadrature amplitude modulation (QAM) signals instead, rather than using VSB signals. This presents television receiver designers with the challenge of designing receivers that are capable of receiving either type of transmission and of automatically selecting suitable reception apparatus for the type of transmission currently being received.

The VSB DTV signals and the QAM DTV signals must be transmitted through the same 6 MHz channel width. Each transmission adopts the necessary encoding and forward-error-correction coding to suit the expected channel characteristics. Processing after symbol decoding is similar in receivers for the VSB DTV signals and in receivers for the QAM DTV signals, since the data format supplied for symbol encoding is similar in transmitters for the VSB DTV signals and in transmitters for the QAM DTV signals. The data recovered by symbol decoding are supplied as input signal to a data de-interleaver, and the de-interleaved data are supplied to a Reed-Solomon decoder. Error-corrected data are supplied to a data de-randomizer which regenerates packets of data for a packet decoder. Selected packets are used to reproduce the audio portions of the DTV program, and other selected packets are used to reproduce the video portions of the DTV program. A television receiver designer of ordinary skill in the art will readily observe also that the tuners are quite similar in receivers for the VSB DTV signals and in receivers for the QAM DTV signals. The differences in the receivers reside in the synchrodyning procedures used to translate the final IF signal to baseband and in the symbol decoding procedures.

The cable industry may adopt QAM, rather than the VSB system proposed by the ATSC for cablecasting. Since there is a strong commercial preference for a TV receiver capable of receiving both over-the-air broadcasting and cablecasting, a receiver that is capable of receiving either VSB or QAM DTV signals is desirable. Such a receiver is more economical in design if it does not duplicate the similar tuner circuitry prior to synchrodyning to baseband and the similar receiver elements used after the symbol decoding circuitry. The invention will be described in the context of such a receiver.

FIG. 1 shows a tuner 5 comprising elements 10–21 that selects one of channels at different locations in the frequency band for DTV signals and performs plural frequency conversion of the selected channel to a final intermediate-frequency signal in a final intermediate-frequency band. FIG. 1 shows a broadcast receiving antenna 6 arranged to capture the DTV signals for the tuner 5. Alternatively, the tuner 5 can be connected for receiving DTV signals from a narrowcast receiving antenna or from a cablecast transmission system.

More particularly, in the tuner 5 shown in FIG. 1, a channel selector 10 designed for operation by a human being determines the frequency of first local oscillations that a frequency synthesizer 11, which functions as a first local oscillator, furnishes to a linear first mixer 12 for heterodyning with DTV signals received from the antenna 6 or an alternative source of such signals. The first mixer 12 upconverts the received signals in the selected channel to a prescribed first intermediate-frequency band (e. g., a 917–923 MHz first IF band) located above the UHF television broadcast band, and an LC filter 13 is used to reject the unwanted image frequencies that accompany the upconversion result supplied from the first mixer 12 as well as harmonics of DTV signals in the UHF band. The first intermediate-frequency signal resulting from the upconversion, supplied as the filter 13 response, is applied as the input signal to a first intermediate-frequency amplifier 14, which supplies amplified first IF signal for driving a first surface-acoustic-wave (SAW) filter 15. This first IF amplifier 14 provides constant, linear gain to overcome the 10–12 dB insertion loss in the SAW filter 15; and drives the SAW filter 15 from the source impedance prescribed for avoiding multiple reflections that interfere with obtaining good group delay. The upconversion to the rather high-frequency first intermediate frequencies facilitates the SAW filter 15 having a large number of poles and zeroes. The SAW filter 15 has a 6-MHz-wide −1 dB to −1 dB bandwidth, and its passband is designed to pass those frequencies obtained by converting frequencies extending from the lower limit frequency of the television channel up to the upper limit frequency of the television channel to the first intermediate-frequency band. The SAW filter 15 determines the overall bandwidth of the DTV receiver of FIGS. 1 and 2.

Second local oscillations from a second local oscillator 16 are supplied to a second mixer 17 for heterodyning with the response of the first SAW filter 15, to generate a response to DTV signal translated to a second intermediate-frequency band below the frequencies assigned for television broadcasting. A second SAW filter 18 is used for rejecting the unwanted image frequencies that accompany the downconversion result supplied from the second mixer 17. The SAW filter 18 has flat amplitude response over a bandwidth of at least 6 MHz. The SAW filter 18 has linear phase response over that bandwidth or, alternatively, its phase response is modified for optimizing overall phase response for the DTV receiver up to the point that synchrodyning to baseband is completed. During the period of transition from NTSC television transmissions to digital television transmissions, traps for sound and video carriers of adjacent-channel NTSC television transmissions will usually be included in at least one of the SAW filters 15 and 18. It is preferable to put the traps into the SAW filter 15 and not into the SAW filter 18. The adjacent-channel NTSC sound and video carriers are then excluded from the second mixer 17, and the design of the SAW filter 18 is simplified.

The second mixer 17 is a linear mixer and is designed to drive the SAW filter 18 from the source impedance prescribed for suppressing multiple reflections. In the design shown in FIG. 1 (and in the design shown in FIG. 13) it is presumed the second mixer 17 is of a design that provides sufficient conversion gain to overcome insertion loss in the SAW filter 18. If the second mixer 17 is of a design that does not provide substantial conversion gain, in an alternative embodiment of the invention the gain in the first IF amplifier 14 is increased to overcome insertion losses in both the SAW filters 15 and 18. In still another embodiment of the invention, an additional fixed-gain amplifier is included between the SAW filter 15 and the second mixer 17 to compensate for the insertion loss in the SAW filter 18.

The second IF signal supplied as the response of the second SAW filter 18 is applied as input signal to a second intermediate-frequency amplifier 19, which generates an amplified second IF signal response to its input signal. The second intermediate-frequency amplifier 19 is subject to reverse automatic gain control. Oscillations from a third local oscillator 20 are heterodyned with the amplified second IF signal response in a linear third mixer 21. The frequency of the oscillations from the third local oscillator 20 is chosen such that the third mixer 21 supplies a third intermediate-frequency signal response in a third intermediate-frequency band closer to baseband than the second IF band, which third IF band is low enough in frequency to make analog-to-digital conversion feasible.

The design of the tuner 5 may follow the example of the Grand Alliance DTV receivers in which the second local oscillations are at a frequency below the first IF band. Alternatively, the second local oscillations can be at a frequency above the first IF band, which is preferable in that the second oscillations do not fall within a UHF TV channel. The first mixer 12 is presumed to generate the first IF band as the difference of the frequency spectrum of the TV signal selected for reception subtracted from the frequency of the first local oscillations, resulting in the DTV signal as translated to the first IF band exhibiting a reversed frequency spectrum respective to that of the DTV signal as broadcast. Therefore using second local oscillations above the first IF band results in the DTV signal as translated to the second IF band exhibiting a frequency spectrum that is not reversed from the transmitted spectrum, while using second local oscillations below the first IF band results in the DTV signal as translated to the second IF band exhibiting a frequency spectrum that is reversed from the transmitted spectrum. The choice of frequencies for the second local oscillations and the third local oscillations is an important consideration when deciding how the VSB and QAM DTV signals are to repose in a third IF band closer in frequency to baseband than the second IF band.

During a transitional period expected to extend over years analog TV signals as well as DTV signals will be broadcast. Accordingly, the behavior of the DTV reception portions of the receiver in the presence of strong co-channel interference or when tuned to receive an analog TV signal should be taken into account when selecting the frequencies of the second local oscillations and the third local oscillations. Furthermore, during the transitional period it is likely that television receivers capable of receiving analog TV signals as well as DTV signals will be designed. Such a receiver can use the same RF amplifier and first detector for both analog and digital TV signals, with the analog TV reception circuitry also being of plural-conversion type. While IF amplifier design considerations differ for analog and digital TV signals, the plural-conversion analog TV reception circuitry advantageously uses the same second local oscillator as the DTV reception circuitry. The analog TV reception circuitry can detect intercarrier sound IF signal by rectifying amplified IF signals in the VHF second IF band and can synchronously detect the IF signals in the VHF second IF band using analog synchronous detection methods for recovering baseband composite video signal. Where composite video signal is to be placed into digital form for processing in the receiver, it may be desirable to convert the amplified IF signals in the VHF second IF band to final IF signals in a final IF band close to baseband, digitize those final IF signals and perform synchronous detection in the final IF band for recovering baseband composite video signal. It is likely that composite video signal will be placed into digital form for processing in a DTV receiver with a viewscreen, in order to implement interpolation procedures associated with the scan conversion of NTSC signals. When the analog TV reception circuitry is of triple-conversion type, it advantageously uses the same third local oscillator as the DTV reception circuitry. Accordingly, the choice of frequencies for the second and third local oscillations supplied by the second local oscillator 16 and the third local oscillator 20 will be influenced by NTSC signal considerations during the transitional period.

If the carrier of the VSB DTV signal as translated to the third IF band is to be lower in frequency than the midband frequency of the third IF band, the third local oscillations must be closer in frequency to the VSB carrier as translated to the second IF band than the midband frequency of the second IF band. If the first IF band is at 917–923 MHz and 876 MHz second local oscillations are used, the VSB carrier is translated to just below 47 MHz in a 41–47 MHz second IF band. Because of spectrum reversal owing to the second local oscillations being below the first IF band, the requirements on offsetting the VSB carrier from zero frequency in the third IF band place the third local oscillations above 48 MHz, placing their second harmonic in the FM broadcast band. This presents some risk of interference with weak reception in a broadcast FM receiver located near the DTV receiver, owing to capture of the limiter in the FM receiver. One may prefer to locate the second IF band at a somewhat lowe frequency, so the third local oscillations are below 44 MHz. (In a single-conversion television receiver the intermediate frequencies are made as high as possible, while remaining below the very-high-frequency television broadcast band and avoiding the second harmonic of NTSC sound carrier falling into the FM broadcast band, in order to prevent image frequencies from the single conversion falling too closely the desired signal to be selected against by tuned radio-frequency amplification. There is no such constraint in a plural-conversion tuner.) Locating the second IF band at a lower frequency makes it more difficult to provide selectivity with the SAW filter 18, however, which is further reason for the SAW filter 15 in the UHF first IF band defining the overall selection characteristic of the receiver. The frequency of second oscillations can be increased to fall just above the 890 MHz upper limit frequency of channel 83, and the first IF band adjusted upward to locate the second IF band an appropriate amount below the frequency of third local oscillations reduced to below 44 MHz. For example, if the frequency of third local oscillations is chosen to be at 43.4 MHz and if the VSB carrier as translated to third IF band is at 2.69 MHz, so the third IF band is 2.4–8.4 MHz, the second IF band is at 35–41 MHz. If the frequency of second local oscillations chosen to be at 890.5 MHz, the first IF band must be at 925.5–931.5 MHz.

If the carrier of the VSB DTV signal as translated to the third IF band is to be lower in frequency than the midband frequency of the third IF band, but there is no spectrum reversal in the second IF band because of the second local oscillations being at a frequency above the first IF band, the third local oscillations will be at a frequency below the second IF band. The third harmonic of these third local oscillations preferably should be above the 88–108 MHz FM broadcast band, so the third local oscillations preferably are of a frequency somewhat above 36 MHz. The NTSC sound carrier is located near the top of the second IF band; and the second harmonic of this FM carrier should fall below the FM broadcast band, so this carrier cannot be above 43.75 MHz. If the VSB carrier as translated to third IF band is at 2.69 MHz, so the third IF band is 2.4–8.4 MHz, and the third local oscillations are at 36.6 MHz, the second IF band is at 39–45 MHz, placing the NTSC sound carrier at a frequency that can cause interference with a broadcast FM receiver. The NTSC sound carrier is too high in frequency even if the third local oscillations are at 36.0 MHz.

If the third local oscillations are at 36.0 MHz and if the VSB carrier as translated to third IF band is at 1.35 MHz, so the third IF band is 1–7 MHz, the second IF band is at 37–44 MHz. The NTSC sound carrier is just barely low enough in frequency. If the carrier of the VSB DTV signal as translated to the third IF band is to be lower in frequency than the midband frequency of the third IF band, then, it is better to use second local oscillations of a frequency below the first IF band in frequency so there is a reversal of DTV signal frequency spectrum in the second IF band.

If the carrier of the VSB DTV signal is to be higher in frequency than the midband frequency in the third IF band, the third local oscillations must be closer in frequency to the midband frequency of the second IF band than the VSB carrier as translated to second IF band. If the VSB carrier is just above the lower limit frequency of the second IF band, owing to the first local oscillations being above the first IF band, in order for the carrier of the VSB DTV signal to be above the midband frequency in the third IF band, the third local oscillations must be above the second IF band. It is preferable that the third oscillations are lower in frequency than 44 MHz, to prevent their second harmonic falling in the FM broadcast band. Also, the NTSC sound carrier is at the top of the second IF band, and it is desirable to prevent its second harmonic falling in the FM broadcast band. If there is no spectrum reversal owing to the second local oscillations being above the first IF band and if further the third local oscillations must be above the second IF band to place the carrier of the VSB DTV signal above the midband frequency in the third IF band, the second IF band is preferably located lower in frequency than 41–47 MHz. If the second IF band is located lower than 36–42 MHz, third harmonics of signals in this band overlap the top portion of the FM broadcast band. Within these constraints, the VSB carrier in the third IF band cannot be higher than 7.69 MHz. This requirement can be met by a VSB carrier that is the third subharmonic of 21.52 MHz, the second harmonic of the 10.76 megasample per second symbol rate for VSB DTV.

If the VSB carrier is just below the upper limit frequency of the second IF band owing to the second local oscillations being below the first IF band, in order for the carrier of the VSB DTV signal to be above the midband frequency in the third IF band, the third local oscillations must be below the second IF band. If the VSB carrier is just below 47 MHz in a 41–47 MHz second IF band, third local oscillations below the second IF band, but above 36 MHz, have their harmonics outside the FM broadcast band. Within these constraints, the VSB carrier in the third IF band can be as high as 10.69 MHz. Locating the first IF band slightly higher in frequency allows a VSB carrier of 10.76 MHz. A 41–47 MHz second IF band is possible without the second local oscillations falling in the UHF TV broadcast band. If the frequency of second local oscillations chosen to be at 890.5 MHz, the first IF band must be at 931.5–937.5 MHz.

The third IF signal response supplied from the third mixer 21 is the final intermediate-frequency output signal of the tuner 5, which is supplied to a subsequent analog-to-digital converter (ADC) 22 for digitization. This final IF signal occupies a frequency band 6 MHz wide, the lowest frequency of which is above zero frequency. The lowpass analog filtering of the third mixer 21 response done in the ADC 22 as a preliminary step in analog-to-digital conversion suppresses the image frequencies of the third intermediate frequencies, and the second SAW filter 18 has already restricted the bandwidth of the third intermediate-frequency signals presented to the ADC 22 to be digitized; so the ADC 22 functions as a bandpass analog-to-digital converter. The sampling of the lowpass analog filter response in the ADC 22 as the next step in analog-to-digital conversion is done responsive to pulses in a first clock signal supplied from a sample clock generator 23.

The sample clock generator 23 preferably includes a crystal oscillator capable of frequency control over a relatively narrow range for generating sinusoidal oscillations at a multiple of symbol rate. A symmetrical clipper or limiter generates a square-wave response to these cissoidal oscillations to generate the first clock signal, which the ADC 22 uses to time the sampling of the final IF signal after filtering to limit bandwidth. The frequency of the cissoidal oscillations generated by the crystal oscillator in the sample clock generator 23 can be determined by an automatic frequency and phase control (AFPC) signal developed in response to symbol frequency components of the received DTV signal, for example, as will be described in detail further on in this specification. The pulses in the first clock signal recur at a $21.52 * 10^6$ pulses-per-second rate, twice the $10.76 * 10^6$ symbols-per-second baud rate for VSB signals and four times the $5.38 * 10^6$ symbols-per-second baud rate for QAM signals. At this $21.52 * 10^6$ pulses-per-second clock rate, placing the final IF signal so its mid-frequency is above 5.38 MHz reduces the number of $21.52 * 10^6$ samples-per-second rate samples in the QAM carrier to less than four, which undesirably reduces the uniformity of synchrodyne response supplied for symbol decoding.

The ADC 22 supplies real digital response of 10-bit or so resolution to the samples of the band-limited final IF signal, which digital responses are converted to complex digital samples by the circuitry 24. Various ways to construct the circuitry 24 are known. The imaginary digital samples at the QAM carrier frequency may be generated using a Hilbert transformation filter, for example, as described in U.S. Pat. No. 5,479,449. If the frequency band 6 MHz wide occupied by the final IF signal has a lowest frequency no lower than a megahertz or so, it is possible to keep the number of taps in the Hilbert transformation filter reasonably small and thus keep the latency time of the filter reasonably short. Other ways to construct the circuitry 24 described in U.S. Pat. No. 5,548,617 rely on the differential delay between the responses of two infinite-impulse-response (IIR) filters being substantially equal to 90° phase shift at all frequencies. Still other ways to construct the circuitry 24 rely on the differential delay between the responses of two finite-impulse-response (FIR) filters being substantially equal to 90° phase shift at all frequencies.

In the FIG. 1 receiver circuitry the complex digital samples of final IF signal supplied from the circuitry 24 are applied to circuitry 25 for synchrodyning the QAM signal to baseband. The circuitry 25 supplies a stream of real samples and a stream of imaginary samples in parallel to a symbol de-interleaver 26, to provide baseband description of the QAM modulating signal. The QAM synchrodyning circuitry 25 receives complex-number digital descriptions of two phasings of the QAM carrier, as translated to final intermediate frequency and in quadrature relationship with each other, from read-only memory 27. ROM 27, which comprises sine and cosine look-up tables for QAM carrier frequency, is addressed by a first address generator 28. The first address generator 28 includes an address counter (not explicitly shown in FIG. 1) for counting the recurrent clock pulses in the first clock signal generated by the sample clock generator 23. The resulting address count is augmented by a symbol phase correction term generated by QAM de-rotator correction circuitry, thereby to generate the addressing for the ROM 27. The QAM synchrodyne circuitry 25, the first address generator 28, and the operation of each will be explained in greater detail further on in this specification.

In the FIG. 1 receiver circuitry the complex digital samples of final IF signal supplied from the circuitry 24 are also applied to circuitry 30 for synchrodyning the VSB signal to baseband. The VSB synchrodyning circuitry 30 supplies streams of samples descriptive of real and imaginary components of the vestigial-sideband modulating signal as synchrodyned to baseband. The VSB synchrodyning circuitry 30 receives complex-number digital descriptions of two phasings of the VSB carrier, as translated to final intermediate frequency and in quadrature relationship with each other, from read-only memory 31. ROM 31, which comprises sine and cosine look-up tables for VSB carrier frequency, is addressed by a second address generator 32. The second address generator 32 includes an address counter (not explicitly shown in FIG. 1) for counting the recurrent clock pulses in the first clock signal generated by the sample clock generator 23. The current preference is that this address counter is the same address counter used by the first address generator 28. The resulting address count is augmented by a symbol phase correction term generated by symbol phase correction circuitry, thereby to generate the addressing for the ROM 31. The VSB synchrodyne circuitry 30, the second address generator 32, and the operation of each will be explained in greater detail further on in this specification.

A digital-signal multiplexer 33 functions as a synchrodyne result selector that selects as its response either a first or a second one of two complex digital input signals supplied thereto, the selection being controlled by a detector 34 for detecting the zero-frequency term of the real samples from the VSB synchrodyne circuitry 30. When the zero-frequency term has essentially zero energy, indicating the absence of pilot carrier signal that accompanies a VSB signal, the multiplexer 33 selectively responds to its first complex digital input signal, which is the de-interleaved QAM synchrodyne-to-baseband result supplied from the de-interleaver 26. When the zero-frequency term has substantial energy, indicating the presence of pilot carrier signal that accompanies a VSB signal, the multiplexer 33 selectively responds to its second complex digital input signal comprising the real and imaginary components of the baseband response of the VSB synchrodyne circuitry 30.

The response of the synchrodyne result selection multiplexer 33 is resampled in response to a second clock signal from the sample clock generator 23 in 2:1 decimation circuitry 35, to reduce the sample rate of complex baseband response down to the 10.76 MHz VSB symbol rate, which is twice the 5.38 MHz QAM symbol rate. The 2:1 decimation of the multiplexer 33 response prior to its application as input signal to an amplitude-and-group-delay equalizer 36 reduces the hardware requirements on the equalizer. Alternatively, rather than 2:1 decimation circuitry 35 being used after the synchrodyne result selection multiplexer 33, the baseband responses of the QAM synchrodyne circuitry 25 and of the VSB synchrodyne circuitry 30 can each be resampled in response to a second clock signal from the sample clock generator 23 to carry out 2:1 decimation before the synchrodyne result selection multiplexer 33.

Figure 2:
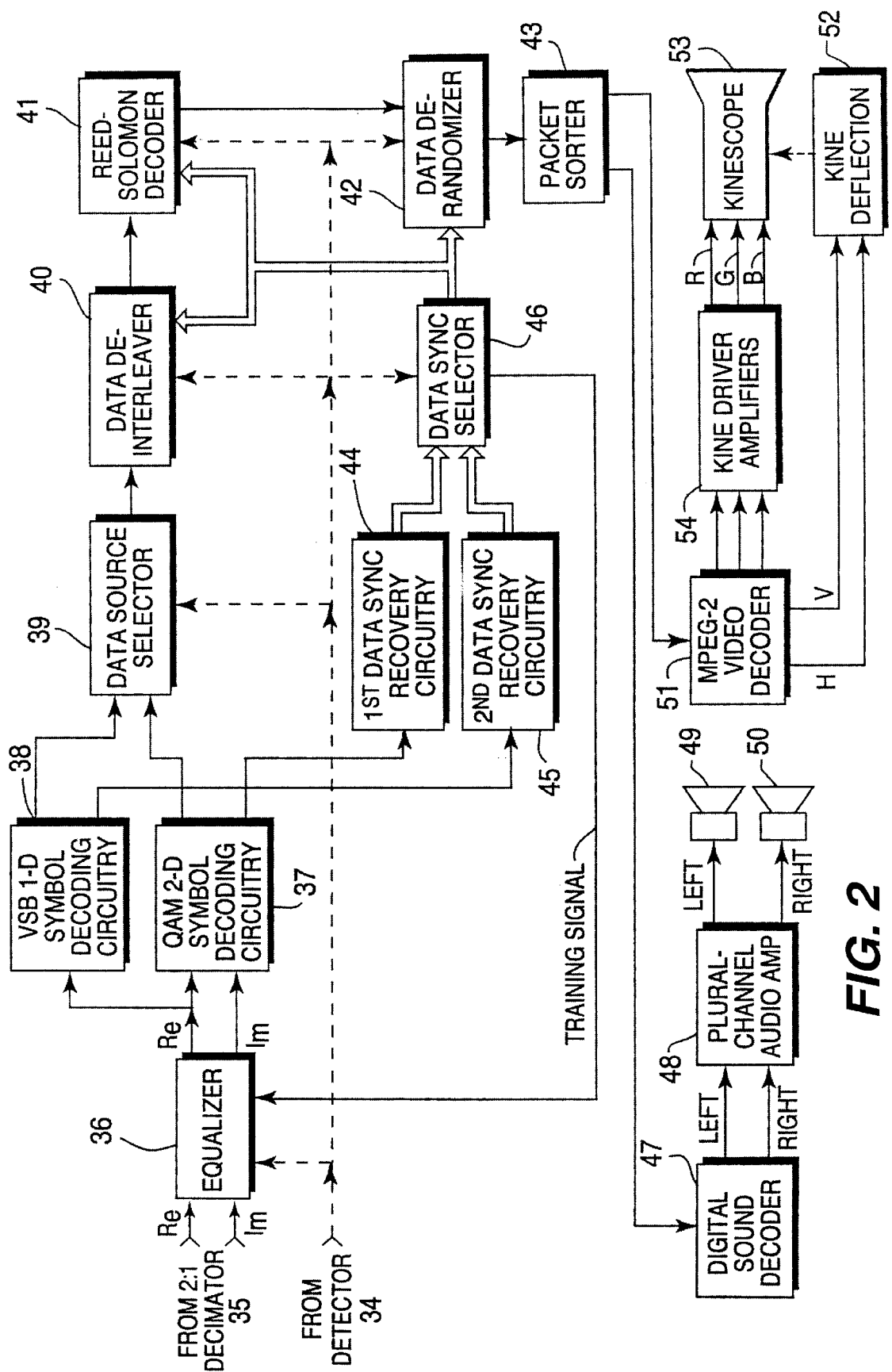
FIG. 2 is a block schematic diagram of the remaining portions of the DTV signal radio receiver, which are not shown in FIG. 1.

FIG. 2 shows the amplitude-and-group-delay equalizer 36, which converts a baseband response with an amplitude-versus-frequency characteristic that tends to cause inter-symbol error to a more optimum amplitude-versus-frequency characteristic that minimizes the likelihood of inter-symbol error. The amplitude-and-group-delay equalizer 36 can be a suitable one of the monolithic ICs available off-the-shelf for use in equalizers. Such an IC includes a multiple-tap digital filter used for amplitude-and-group-delay equalization, the tap weights of which filter are programmable; circuitry for selectively accumulating training signal and temporarily storing the accumulation results; and a microcomputer for comparing the temporarily stored accumulation results with an ideal training signal as known a priori and for calculating updated tap weights of the multiple-tap digital filter used for amplitude-and-group-delay equalization.

The response of the amplitude-and-group-delay equalizer 36 is applied as input signal to a two-dimensional trellis decoder 37, which performs the symbol decoding that recovers a digital data stream from a QAM-origin signal. The response of the amplitude-and-group-delay equalizer 36 is also applied as input signal to a one-dimensional trellis decoder 38, which performs the symbol decoding that recovers a digital data stream from a VSB-origin signal. Preferably the trellis decoder 38 uses data-slicing techniques as described in U.S. Pat. No 5,748,226 entitled "DIGITAL TELEVISION RECEIVER WITH ADAPTIVE FILTER CIRCUITRY FOR SUPPRESSING NTSC CO-CHANNEL INTERFERENCE" and issued May 5, 1998 pursuant to U.S. patent application Ser. No. 08/746,520 filed Nov. 12, 1996. A digital-signal multiplexer 39 functions as a data source selector that selects as its response either a first or a second one of two digital input signals thereto, the selection being controlled by the detector 34 for detecting the zero-frequency term of the real samples from the VSB synchrodyne circuitry 30. When the zero-frequency term has essentially zero energy, indicating the absence of pilot carrier signal that accompanies a VSB signal, the multiplexer 39 selectively responds to its first digital input signal, selecting as the source of its digital data output the two-dimensional trellis decoder 37 that decodes the symbols received in the QAM signal. When the zero-frequency term has substantial energy, indicating the presence of pilot carrier signal that accompanies a VSB signal, the multiplexer 39 selectively responds to its second digital input signal, selecting as the source of its digital data output the one-dimensional trellis decoder 38 that decodes the symbols received in the VSB signal.

The data selected by the data source selection multiplexer 39 are applied to a data de-interleaver 40 as its input signal, and the de-interleaved data supplied from the data de-interleaver 40 are applied to a Reed-Solomon decoder 41. The data de-interleaver 40 is often constructed within its own monolithic IC and is made so as to respond to the output indications from the pilot carrier presence detector 34 to select the de-interleaving algorithm suitable to the DTV signal currently being received, whether it be of QAM or VSB type; this is a mere matter of design. The Reed-Solomon decoder 41 is often constructed within its own monolithic IC and is made so as to respond to the output indications from the pilot carrier presence detector 34 to select the appropriate Reed-Solomon decoding algorithm for the DTV signal currently being received, whether it be of QAM or VSB type; this also is a mere matter of design. Error-corrected data are supplied from the Reed-Solomon decoder 41 to a data de-randomizer 42, which regenerates packets of data for a packet sorter 43. The data de-randomizer 42 is made so as to respond to the output indications from the pilot carrier presence detector 34 to select the appropriate data de-randomizing algorithm for the DTV signal currently being received, whether it be of QAM or VSB type; this is a mere matter of design, too.

First data synchronization recovery circuitry 44 recovers the data synchronizing information included in the data output of the two-dimensional trellis decoder 37, and second data synchronization recovery circuitry 45 recovers the data synchronizing information included in the data output of the one-dimensional trellis decoder 38. A data sync selector 46 selects between the data synchronizing information as provided by the data sync recovery circuitry 44 and as provided by the data sync recovery circuitry 45, the selection being controlled by the detector 34 for detecting the zero-frequency term of the real samples from the VSB synchrodyne circuitry 30. When the zero-frequency term has essentially zero energy, indicating the absence of pilot carrier signal that accompanies a VSB signal, the data sync selector 46 selects for its output signals the data synchronizing information provided by the data sync recovery circuitry 44. When the zero-frequency term has substantial energy, indicating the presence of pilot carrier signal that accompanies a VSB signal, the data sync selector 46 selects for its output signals the data synchronizing information provided by the data sync recovery circuitry 45.

When the data sync selector 46 selects for its output signals the data synchronizing information provided by the data sync recovery circuitry 45, the initial data lines of each data field are selected for application to the amplitude-and-group-delay equalizer 36 as training signal. The occurrences of two consecutive 63-sample PR sequences are detected within the data sync recovery circuitry 45 to provide data-field indexing information to the data sync selector 46.

The standards for a QAM DTV signal are not as well defined at this time as the standards for a VSB DTV signal. A 32-state QAM signal provides sufficient capacity for a single HDTV signal, without having to resort to compression techniques outside MPEG standards, but commonly some compression techniques outside MPEG standards are employed to encode the single HDTV signal as a 16-state QAM signal. The occurrence of a prescribed 24-bit word is detected by the data sync recovery circuitry 44 to generate data-field indexing information for application to the data sync selector 46. A multiplexer within the data sync selector 46 selects between the data-field indexing information respectively supplied by the data sync recovery circuitry 44 and the data sync recovery circuitry 45; the data-field indexing information thus selected is supplied to the data de-interleaver 40, the Reed-Solomon decoder 41, and the data de-randomizer 42. At the time this specification is written, there is no training signal included in the QAM DTV signal. Accordingly, the amplitude-and-group-delay equalizer 36 is arranged to provide a flat amplitude-versus-frequency characteristic in response to the VSB pilot carrier presence detector 34 indicating the absence of pilot carrier, and the VSB training signal selected by the data sync recovery circuitry 45 is wired through the data sync selector 46 without need for a multiplexer. Also, there is no data line synchronization signal for QAM DTV transmission, at least not one selected as a standard. The data sync recovery circuitry 44 includes counting circuitry for counting the samples in each data field to generate intra-data-field synchronizing information. This intra-data-field synchronizing information and the intra-data-field synchronizing information (such as data line count) generated by the data sync recovery circuitry 45 are selected between by appropriate multiplexers in the data sync selector 46, for application to the data de-interleaver 40, the Reed-Solomon decoder 41, and the data de-randomizer 42, as required.

The packet sorter 43 sorts packets of data for different applications, responsive to header codes in the successive packets of data. Packets of data descriptive of the audio portions of the DTV program are applied by the packet sorter 43 to a digital sound decoder 47. The digital sound decoder 47 supplies left-channel and right-channel stereophonic sound signals to a plural-channel audio amplifier 48 that drives the plurality of loudspeakers 49, 50. Packets of data descriptive of the video portions of the DTV program are applied by the packet sorter 43 to an MPEG decoder 51, such as of MPEG-2 type. The MPEG decoder 51 supplies horizontal (H) and vertical (V) synchronizing signals to kinescope deflection circuitry 52 that provides for the raster scanning of the viewing screen of a kinescope 53. The MPEG decoder 51 also supplies signals to the kinescope driver amplifiers 54 for applying amplified red (R), green (G) and blue (B) drive signals to the kinescope 53. In variations of the DTV receiver shown in FIGS. 1 and 2, a different display device may be used instead of or in addition to the kinescope 53, and the sound recovery system may be different, consisting of but a single audio channel, or being more elaborate than a simple stereophonic reproduction system.

Referring back to FIG. 1, in order that ROMs 27 and 31 can be used to generate digital complex-number descriptions of the QAM and VSB signal carriers as translated to respective final intermediate frequencies, in response to addressing generated by counting first clock signals, provision must be made to lock the one those final intermediate frequencies that is the carrier of the currently received DTV signal to a submultiple of a multiple of the first clock signal frequency. That is, those final intermediate frequencies must be in whole number ratios with the first clock signal frequency. An automatic phase and frequency control (AFPC) signal is developed in the digital circuitry following the analog-to-digital converter 22 and is used to control the frequency and phase of one of the local oscillators 11, 16 and 20 in the tuner. Using a fixed-frequency third local oscillator 20, and controlling the frequency and phase of the oscillations the second local oscillator 16 provides, is preferred in that alignment of the second IF signal with the second SAW filter 18 can be readily assured. The second SAW filter 18 usually includes traps for adjacent-channel signal components, in which case proper alignment of the second IF signal between these traps is important for preserving its integrity. The symbol clocking is made to exhibit a high degree of frequency stability. By locking the carrier of the final intermediate-frequency (IF) signal in frequency and phase to a submultiple of a multiple of the symbol clock frequency, the AFPC for correcting frequency and phase error in the carrier as translated to a final intermediate frequency invariably operates to correct dynamic symbol phase error as well, eliminating the, need for a separate phase tracker to correct dynamic symbol phase error.

FIG. 1 denominates a digital multiplexer 55 as "AFPC selector". The multiplexer 55 responds to the pilot carrier presence detector 34 indicating that a pilot carrier is included in the currently received DTV signal for selecting, as an input signal for a digital lowpass filter 56, the imaginary output signal of the baseband response of the VSB synchrodyne circuitry 30. The response of lowpass filter 56 is a digital AFPC signal supplied as input signal to a digital-to-analog converter (DAC) 57. The output signal from the DAC 57 is an analog AFPC signal, which is subjected to further lowpass filtering in an analog lowpass filter 58, the response of which filter 58 is used for controlling the frequency and phase of the oscillations that the second local oscillator 16 provides. Analog lowpass filtering is advantageous to use for realizing long-time-constant lowpass filtering because there is reduced need for active devices as compared to digital lowpass filtering. Since the shunt capacitor of a resistance-capacitance lowpass filter section can be at the interface between a tuner 5 IC and the IC containing the digital synchrodyning circuitry, the analog lowpass filtering can be done without any cost in IC pin-out. Doing some digital lowpass filtering is advantageous, however, since the digital lowpass filter response can be subsampled to the DAC 57; the reduced speed requirements on the digital-to-analog conversion reduces the cost of the DAC 57. This procedure is similar to that used in the AGC circuitry described at the end of this specification with reference to FIG. 13 of the drawing, and the third clock signal developed for the AGC circuitry can be used by the DAC 57 and can be used to reset an accumulator the digital lowpass filter 56 includes for averaging samples of filter input signal.

The multiplexer 55 responds to the pilot carrier presence detector 34 indicating that a pilot carrier is not included in the currently received DTV signal for selecting the input signal for the digital lowpass filter 56 from the circuitry for processing a QAM DTV signal. FIG. 1 shows the product output signal of a digital multiplier 29 being provided for such selection. The digital multiplier 29 multiplies together the real and imaginary output signals of the QAM synchrodyne circuitry 25 to generate an unfiltered digital AFPC signal. The generation of the unfiltered digital AFPC signal is very similar to that in the well-known Costas loop. In the Costas loop the AFPC signal is used to control the frequency and phase of the digital local oscillations used for synchrodyning received signals to baseband. The FIG. 1 arrangement departs from this procedure, the AFPC signal being used instead to control the frequency and phase of the analog oscillations generated by the second local oscillator 16. This regulates the frequency and phase of the final IF signal supplied to the ADC 22 for digitization and for subsequent synchrodyning to baseband in the digital regime. As is the case with the Costas loop, the multiplier 29 is preferably of especial design in which the real signal is converted to a ternary signal for multiplying the imaginary signal; this simplifies the digital multiplier and improves the pull-in characteristics of the AFPC loop.

The second intermediate-frequency amplifier 19, the third local oscillator 20 (except for its outboard crystal and other frequency selection components), and the third mixer 21 are advantageously constructed within the confines of a monolithic IC; since the output signal of the third mixer 21 is at a different frequency than the input signal to the second IF amplifier 19, the second IF amplifier 19 can have high gain without attendant high risk of unwanted regeneration. The first IF amplifier 14, the second local oscillator 16 (except for its outboard crystal and other frequency selection components) and the second mixer 17 can be constructed within the confines of the same IC, or they may be constructed otherwise—e.g., within other integrated circuitry. The analog-to-digital converter (ADC), as customary, will be a flash type with at least ten bits resolution and is preferably constructed within the confines of a different monolithic IC than the IF amplifiers. The analog lowpass filter at the input of the converter isolates the sampling circuitry, with its associated switching transients, from the IC in which the high-gain second IF amplifier 19 is located (and in some cases, in which the first IF amplifier 14 is also located). This reduces the likelihood of unwanted regeneration in the tuner 5. Considerable die area is required for the resistance ladder used in establishing the quantizing levels and for the large number of analog comparators involved in an ADC of flash type, so often such an ADC does not share a monolithic IC with other elements anyway.

The elements 23–35, 55 and 56 are advantageously constructed within the confines of a single monolithic integrated circuit (IC), to reduce the number of wiring connections made outside the confines of a monolithic IC. The synchrodyning circuits 25 and 30 both receive input signals from the real-to-complex sample converter 24, and portions of their respective address generators 28 and 32 can usually be provided by circuitry shared in common. It is advantageous that this single monolithic IC and the circuitry that follows this IC include all the circuitry for automatically selecting the appropriate mode of reception for the DTV transmission currently being received. Such practice avoids the need for operating the third local oscillator at two markedly different frequencies, depending on whether a DTV signal is of QAM type or is of VSB type. Operation of the third local oscillator at two markedly different frequencies is normally associated with the use of two different crystals for setting those frequencies. Operating the third local oscillator at essentially the same frequency, no matter whether the DTV signal is of QAM type or is of VSB type, saves the cost of the extra crystal and of the electronic switching circuitry involved with the use of two crystals. Furthermore, the reliability of the tuner 5 is improved by the reduction in the amount of circuitry located outside the monolithic integrated circuitry.

If the ADC is not constructed within an IC, all or substantially all its own, it is advantageous to include it in the IC that contains the circuitry for synchrodyning VSB DTV signals and the circuitry for synchrodyning QAM DTV signals to baseband, since the signals for clocking the sampling of the final IF signal by the ADC are to be generated within that IC. Furthermore, the analog lowpass filter at the input of the converter still isolates the sampling circuitry, with its associated switching transients, from the IC(s) in which high-gain IF amplification is done.

Figure 3:
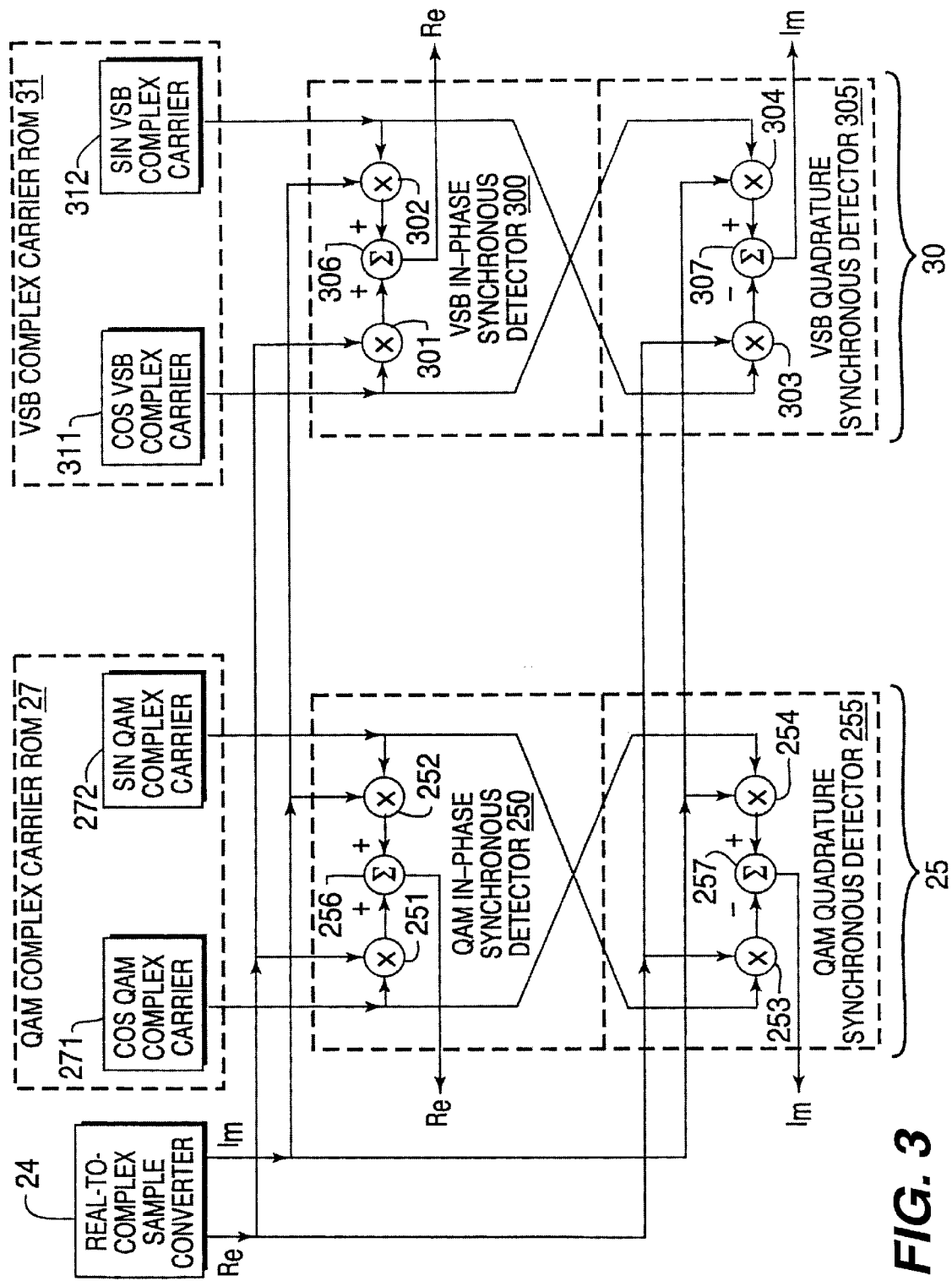
FIG. 3 is a detailed block schematic diagram of digital circuitry for synchrodyning QAM DTV signals to baseband, of digital circuitry for synchrodyning VSB DTV signals to baseband, and of circuitry associated with applying input signals to that QAM and VSB synchrodyning circuitry, as used in a DTV signal radio receiver of the type shown in FIGS. 1 and 2.

FIG. 3 shows in more detail the digital circuitry 25 for synchrodyning QAM DTV signals to baseband. The QAM synchrodyning circuitry 25 includes the QAM in-phase synchronous detector 250 for generating the real portion of its output signal and the QAM quadrature-phase synchronous detector 255 for generating the imaginary portion of its output signal. The QAM synchrodyning circuitry 25 includes a digital adder 256, a digital subtractor 257, and respective first, second, third and fourth digital multipliers 251-254. The QAM in-phase synchronous detector 250 includes the multiplier 251, the multiplier 252, and the adder 256 for adding the product output signals of the multipliers 251 and 252 to generate the real portion of the output signal of the QAM synchrodyning circuitry 25. The first digital multiplier 251 multiplies the real digital samples of final IF signal supplied from the real-to-complex-sample converter 24 by digital samples descriptive of the cosine of the QAM carrier that are read from the look-up table 271 in the ROM 27, and the second digital multiplier 252 multiplies the imaginary digital samples of final IF signal supplied from the real-to-complex-sample converter 24 by digital samples descriptive of the sine of the QAM carrier that are read from the look-up table 272 in the ROM 27. The QAM quadrature-phase synchronous detector 255 includes the multiplier 253, the multiplier 254, and the subtractor 257 for subtracting the product output signal of the multiplier 253 from the product output signal of the multiplier 254 to generate the imaginary portion of the output signal of the QAM synchrodyning circuitry 25. The third digital multiplier 253 multiplies the real digital samples of final IF signal supplied from the real-to-complex-sample converter 24 by digital samples descriptive of the sine of the QAM carrier that are read from the look-up table 272 in the ROM 27, and the fourth digital multiplier 254 multiplies the imaginary digital samples of final IF signal supplied from the real-to-complex-sample converter 24 by digital samples descriptive of the cosine of the QAM carrier that are read from the look-up table 271 in the ROM 27.

FIG. 3 also shows in more detail the digital circuitry 30 for synchrodyning VSB DTV signals to baseband. The VSB synchrodyning circuitry 30 includes the VSB in-phase synchronous detector 300 for generating the real portion of its output signal and the VSB quadrature-phase synchronous detector 305 for generating the imaginary portion of its output signal. The VSB synchrodyning circuitry 30 includes a digital adder 306, a digital subtractor 307, and respective first, second, third and fourth digital multipliers 301–304. The VSB in-phase synchronous detector 300 includes the multiplier 301, the multiplier 302, and the adder 306 for adding the product output signals of the multipliers 301 and 302 to generate the real portion of the output signal of the VSB synchrodyning circuitry 30. The first digital multiplier 301 multiplies the real digital samples of final IF signal supplied from the real-to-complex-sample converter 24 by digital samples descriptive of the cosine of the VSB carrier that are read from the look-up table 311 in the ROM 31, and the second digital multiplier 302 multiplies the imaginary digital samples of final IF signal supplied from the real-to-complex-sample converter 24 by digital samples descriptive of the sine of the VSB carrier that are read from the look-up table 312 in the ROM 31. The VSB quadrature-phase synchronous detector 305 includes the multiplier 303, the multiplier 304, and the subtractor 307 for subtracting the product output signal of the multiplier 303 from the product output signal of the multiplier 304 to generate the imaginary portion of the output signal of the VSB synchrodyning circuitry 30. The third digital multiplier 303 multiplies the real digital samples of final IF signal supplied from the real-to-complex-sample converter 24 by digital samples descriptive of the sine of the VSB carrier that are read from the look-up table 312 in the ROM 31, and the fourth digital multiplier 304 multiplies the imaginary digital samples of final IF signal supplied from the real-to-complex-sample converter 24 by digital samples descriptive of the cosine of the VSB carrier that are read from the look-up table 311 in the ROM 31.

Figure 4:
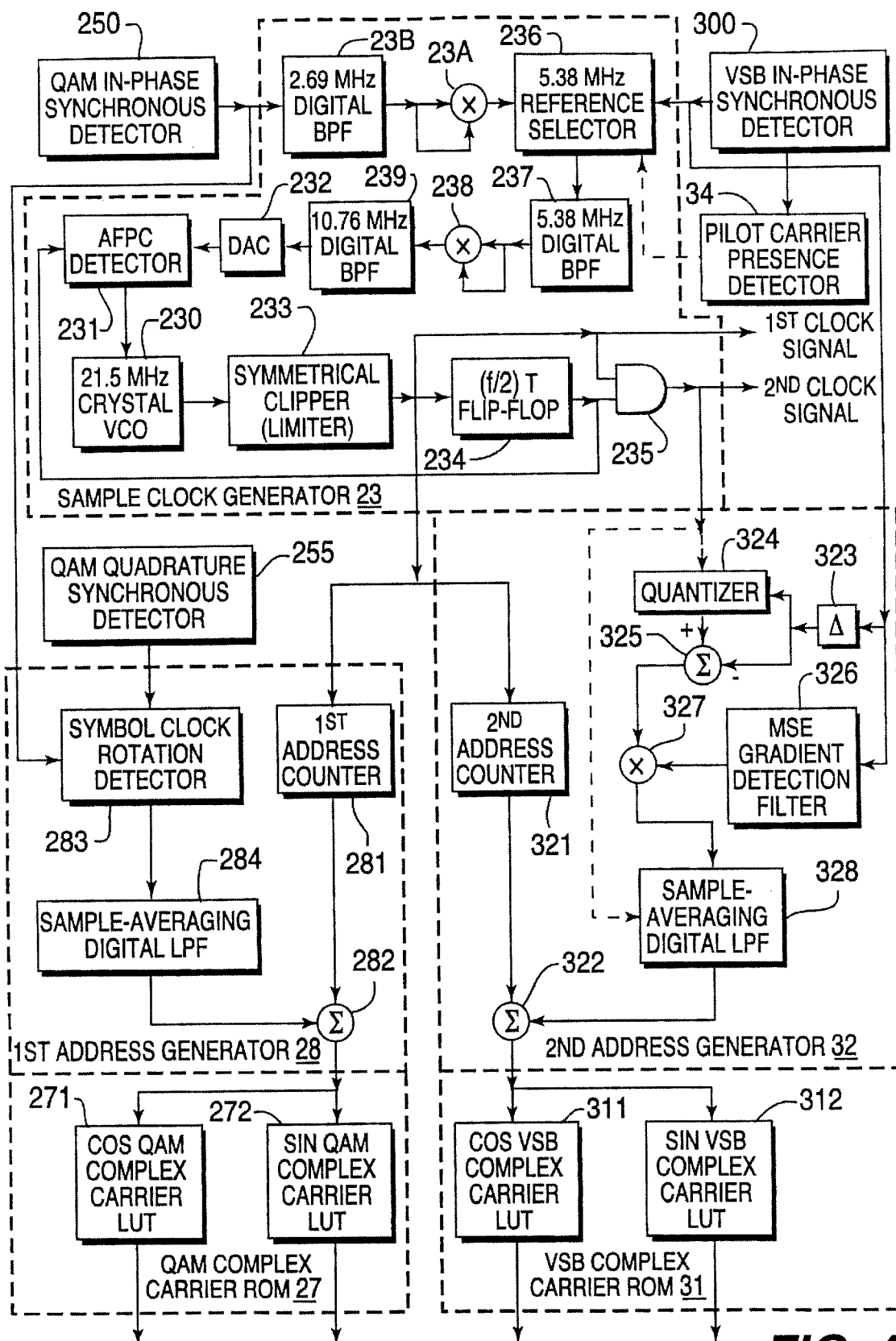
FIG. 4 is a detailed block schematic diagram of circuitry for providing the sample clock generator, the look-up table read-only memories (ROMs) for supplying digital descriptions of the complex carriers used for synchrodyning digital QAM signals and digital VSB signals at final IF signal frequencies each to baseband, and the address generators for those ROMs, which circuitry is included in certain DTV signal radio receivers of the type that embody the invention.

FIG. 4 shows in detail a representative construction of the sample clock generator 23. This construction includes a voltage-controlled oscillator 230 that generates cissoidal oscillations nominally of 21.52 MHz frequency. The oscillator 230 is a controlled oscillator, the frequency and phase of its oscillations being controlled by an automatic frequency and phase control (AFPC) signal voltage. This AFPC signal voltage is generated by an automatic frequency and phase control (AFPC) detector 231, which compares frequency-divided response to the oscillations of the oscillator 230 with a 10.76 MHz reference carrier supplied via an analog 10.76 MHz bandpass filter 232. Preferably, oscillator 230 is of a type using a crystal for stabilizing the natural frequency and phase of its oscillations. A symmetrical clipper or limiter 233 generates an essentially squarewave response to these cissoidal oscillations, which is used as the first clock signal for timing the sampling of the final IF signal in the ADC 22. A frequency-divider flip-flop 234 responds to transitions of the first clock signal in a prescribed sense for generating another square wave with a fundamental frequency of 10.76 MHz, half the frequency of the oscillations of the oscillator 230. This frequency-divided response to the oscillations of the oscillator 230 is supplied to the AFPC detector 231 for comparison with the 10.76 MHz reference carrier supplied via the 10.76 MHz bandpass filter 232. The frequency-divider flip-flop 234 also supplies squarewave output signal with a fundamental frequency of 10.76 MHz to an AND circuit 235 to be ANDed with the first clock signal for generating a second clock signal used by the 2:1 decimator 35 shown in FIG. 1.

The AFPC signal voltage for controlling the VCO 230 is generated by dividing the frequency of the 21.52 MHz reference carrier supplied from the VCO 230 to obtain a subharmonic thereof for comparison with a signal generated by frequency multiplier circuitry. A component of the received DTV signal as synchrodyned to baseband, which component is of a frequency that is a subharmonic of the symbol frequency (or baud frequency), is extracted by frequency-selective filtering. The frequency multiplier circuitry multiplies the frequency of that subharmonic of the symbol frequency by an appropriate factor to generate the signal for comparison with the subharmonic of the 21.52 MHz reference carrier. The details of this procedure will now be specifically described, first presuming the received DTV signal is a VSB signal with a baud rate of $10.76 * 10^6$ symbols per second, and then presuming received DTV signal is a QAM signal with a baud rate of $5.38 * 10^6$ symbols per second.

A digital multiplexer 236 responds to the pilot carrier presence detector 34 detecting pilot carrier accompanying the received DTV signal, which is indicative that the received DTV signal is a VSB signal, to select the real samples of this signal supplied from the VSB in-phase synchronous detector 300 for application to a bandpass FIR digital filter 237 that provides a selective response centered at 5.38 MHz, which selects the first subharmonic of symbol frequency from the VSB signal. Further frequency multiplication of the 5.38 MHz is performed in the analog regime to avoid undersampling problems that arise when attempting to perform further frequency multiplication in the digital regime. An digital-to-analog converter (DAC) 238 converts the filter 237 response to analog form for application to full-wave rectification circuitry 239, which generates harmonics of the filter 237 response including a strong 10.76 MHz component as second harmonic of 5.38 MHz. The analog bandpass filter 232 responds to this 10.76 MHz second harmonic to supply the AFPC detector 231 with 10.76 MHz reference carrier input signal.

The digital multiplexer 236 responds to the pilot carrier presence detector 34 not detecting pilot carrier accompanying the received DTV signal, which is indicative that the received DTV signal is a QAM signal, to select the output signal of a squaring circuit 23A for application to the bandpass filter 237 that provides a selective response centered at 5.38 MHz. A bandpass FIR digital filter 23B that provides a selective response centered at 2.69 MHz for selecting the 2.69 MHz first subharmonic of the symbol frequency of a baseband QAM signal supplies input signal to the squaring circuit 23A, which generates harmonics of the filter 23B response including a strong 5.38 MHz component. This baseband QAM signal can be supplied either from the QAM in-phase synchronous detector 40, as shown in FIG. 4, or from the QAM quadrature-phase synchronous detector 45.

The squaring circuit 23A is shown in FIG. 4 as a digital multiplier receiving the filter 23B response both as multiplier and multiplicand. The squaring circuit 23A can be constructed from logic gates as a digital multiplier, but for the sake of speedier operation is better provided by a ROM storing a look-up table of squares. An absolute-value circuit can be used as a substitute for the squaring circuit in generating harmonics of the response of a preceding filter, but produces weaker second harmonics and so is not preferred.

FIG. 4 also shows in more detail a representative construction of the first address generator 28, which supplies addresses to a cosine look-up table portion 271 and a sine look-up table portion 272 of the ROM 27 that provides complex-number digital descriptions of two phasings of the QAM carrier, as translated to a final intermediate frequency and in quadrature relationship with each other. Transitions of the first clock signal are counted by a first address counter 281 in the first address generator 28 to generate a basic first address signal. This basic first address signal is applied as a first summand to a digital adder 282. A first address correction signal, which is applied to the adder 282 as a second summand, adds to the basic first address signal in the adder 282 for generating as a sum output signal a corrected first address signal for addressing both the cosine look-up table portion 271 and the sine look-up table portion 272 of the ROM 27. A symbol-clock-rotation detector 283 responds to the sequence of real samples of QAM signal as synchrodyned to baseband by the QAM in-phase synchronous detector 250 and to the sequence of imaginary samples of QAM signal as synchrodyned to baseband by the QAM quadrature-phase synchronous detector 255. The symbol-clock-rotation detector 283 detects the misphasing between symbol clocking done at the receiver in accordance with the first clock signal and symbol clocking done at the transmitter, as evidenced in the received QAM signal heterodyned to a final intermediate frequency that is a submultiple of its symbol frequency. Several types of symbol-clock-rotation detector 283 are described and background literature describing certain of them are catalogued in U.S. Pat. No. 5,115,454 issued May 19, 1992 to A. D. Kucar and entitled "METHOD AND APPARATUS FOR CARRIER SYNCHRONIZATION AND DATA DETECTION". A digital lowpass filter 284 averages over many samples (e.g., several million) the misphasing of the symbol clocking done at the receiver as detected by the symbol-clock-rotation detector 283 to generate the first address correction signal supplied to the adder 282 to correct the basic first address. Averaging over so many samples can be done by procedures which accumulate lesser numbers of samples and dump them forward at a reduced sample rate for further accumulation, accumulation and subsampling being repeated a few times with progressively lower subsampling rates.

FIG. 4 also shows in more detail a representative construction of the second address generator 32, which supplies addresses to a cosine look-up table portion 311 and a sine look-up table portion 312 of the ROM 31 that provides complex-number digital descriptions of two phasings of the VSB carrier, as translated to a final intermediate frequency and in quadrature relationship with each other. Transitions of the first clock signal are counted by a second address counter 321 in the second address generator 32 to generate a basic second address signal. This basic second address signal is applied as a first summand to a digital adder 322. A second address correction signal, which is applied to the adder 322 as a second summand, adds to the basic second address signal in the adder 322 for generating as a sum output signal a corrected second address signal for addressing both the cosine look-up table portion 311 and the sine look-up table portion 312 of the ROM 31.

FIG. 4 shows a clocked digital delay line 323 for delaying the samples from the in-phase synchronous detector 300 by a prescribed number of sample periods prior to their being applied as input signal to a quantizer 324, which supplies the quantization level most closely approximated by the sample currently received by the quantizer 324 as input signal. The quantization levels can be inferred from the energy of the pilot carrier accompanying the VSB signal or can be inferred from the result of envelope detection of the VSB signal. The closest quantization level selected by the quantizer 324 as its output signal has the corresponding quantizer 324 input signal subtracted therefrom by a digital adder/subtractor 325, which is operated as a clocked element by including a clocked latch at its output. The difference output signal from the adder/subtractor 325 describes the departure of the symbol levels actually recovered from those that should be recovered, but whether the polarity of the departure is attributable to symbol misphasing being leading or lagging remains to be resolved.

The samples from the in-phase synchronous detector 300 applied as input signal to the clocked digital delay line 323 are applied without delay as input signal to a mean-square-error gradient detection filter 326. The filter 326 is a finite-impulse-response (FIR) digital filter having a $(-\frac{1}{2})$, 1, 0, $(-1)$, $(+\frac{1}{2})$ kernel, the operation of which is clocked by the first sampling clock. The prescribed number of sample periods of delay provided by the clocked digital delay line 323 is such that filter 326 response is in temporal alignment with the difference signal from the adder/subtractor 325. A digital multiplier 327 multiplies the difference signal from the adder/subtractor 325 by the filter 326 response to resolve this issue. The sign bit and the next most significant bit of the two's complement filter 326 response suffice for the multiplication, which permits simplification of the digital multiplier 327 structure. The samples of the product signal from the digital multiplier 327 are indications of the misphasing of the symbol clocking done at the receiver that are averaged over many samples (e.g., several million) by a digital lowpass filter 328 for generating the second address correction signal supplied to the adder 322 to correct the basic second address.

The symbol synchronization techniques used in the second address generator 32 shown FIG. 4 are of the same general type as S. U. H. Qureshi describes for use with pulse amplitude modulation (PAM) signals in his paper "Timing Recovery for Equalized Partial-Response Systems", *IEEE Transactions on Communications*, December 1976, pp. 1326–1330. These symbol synchronization techniques as used in connection with symbol synchronization for VSB signals are specifically described by C. B. Patel et alii in U.S. Pat. No. 5,548,617 issued Aug. 20, 1996 and entitled "DIGITAL VSB DETECTOR WITH BANDPASS PHASE TRACKER USING RADER FILTERS, AS FOR USE IN AN HDTV RECEIVER". In preferred designs of the general type of second address generator 32 shown FIGS. 4 and 5, the clocked digital delay line 323 does not exist as a separate element; instead, an input signal to the quantizer 324 with the requisite number of sample periods of delay for the difference signal from the adder/subtractor 325 being temporally aligned with the filter 326 response is taken from the tapped digital delay line included in the filter 326 for supplying differentially delayed samples to be weighted by the $(-\frac{1}{2})$, 1, 0, $(-1)$, $(+\frac{1}{2})$ kernel before being summed to generate the filter 326 response.

The carrier of a QAM DTV signal and the carrier of a VSB DTV signal are translated to respective final intermediate frequencies that are at a 2.69 MHz remove from each other, since the carrier of the QAM DTV signal is at the center of a 6-MHz-wide TV channel, but the carrier of the VSB DTV signal is only 310 kHz above the lowest frequency of a 6-MHz-wide TV channel. The frequencies of the local oscillators 11, 16 and 20 in the tuner 5 of FIG. 1 can be chosen so that the intermediate frequency to which the carrier of a VSB DTV signal is translated is higher than that to which the carrier of a QAM DTV signal is translated, with the vestigial and full sidebands of the VSB DTV signal being respectively above and below its carrier. Alternatively, the frequencies of the local oscillators 11, 16 and 20 can be chosen so that the intermediate frequency to which the carrier of a VSB DTV signal is translated is lower than that to which the carrier of a QAM DTV signal is translated, with the vestigial and full sidebands of the VSB DTV signal being respectively below and above its carrier.

Preferably the lowest frequency of the final IF signal is above 1 MHz, to keep the ratio of the highest frequency of the final IF signal thereto substantially below 8:1 and thereby ease the filtering requirements for the real-to-complex-sample converter 24. To satisfy this preference in regard to the QAM signal alone, the lowest carrier frequency for the QAM carrier in the final IF signal is 3.69 MHz. To satisfy this preference in regard to the VSB signal alone, the lowest the carrier frequency for the VSB carrier in the final IF signal could be is 1.31 MHz, presuming its full sideband to be above its vestigial sideband in frequency, or 6.38 MHz, presuming its full sideband to be below its vestigial sideband in frequency. Presuming the full sideband of the VSB signal to be above its vestigial sideband in frequency, since the carrier frequency of the VSB carrier most be at least 1.31 MHz, the carrier frequency of the QAM carrier must be at least 4.00 MHz. Presuming the full sideband of the VSB signal to be below its vestigial sideband in frequency, since the carrier frequency of the VSB carrier must least 6.38 MHz, the carrier frequency of the QAM carrier must still be at least 3.69 MHz.

If the sample rate in the ADC 22 is established by the first clock signal from the sample clock generator 23 to be 21.52 * 10⁶ samples per second, preferably the intermediate frequency to which the carrier of a QAM DTV signal is translated is not higher than 5.38 MHz, so that it can be sampled at least four times per cycle. Presuming the full sideband of the VSB signal to be above its vestigial sideband in frequency, this preference constrains the lowest frequency in the final IF signal to being no higher than 2.38 MHz and the carrier of the VSB signal being no higher than 2.69 MHz. FIG. 11 illustrates how, for these presumed conditions, the VSB carrier is constrained to the band 1.31–2.69 MHz, and the QAM carrier is constrained to the band 4.00–5.38 MHz.

Presuming the full sideband of the VSB signal to be below its vestigial sideband in frequency, the QAIM carrier is constrained to the band 3.69–5.38 MHz. Accordingly, the carrier of the VSB signal is constrained to the band 6.38–8.07 MHz in order that the 2.69 MHz offset between carriers is maintained. FIG. 12 illustrates the case where the QAM carrier is constrained to the band 3.69–5.38 MHz and the VSB carrier is constrained to the band 6.38–8.07 MHz.

The final intermediate frequency to which the QAM carrier is translated must be a submultiple of a multiple of the 21.52 MHz sampling rate in order that this carrier can be described on a continuous basis relying on a sine-cosine look-up table in the ROM 27. The final intermediate frequency to which the VSB carrier is translated must be a submultiple of a multiple of the 21.52 MHz sampling rate in order that this carrier can be described on a continuous basis relying on a sine-cosine look-up table in the ROM 31. The final intermediate frequency (m/n) times the 21.52 MHz sampling rate, to which the carrier is translated, preferably has a small value of n, to keep the number of values in the sine-cosine look-up tables stored in ROM reasonably small.

One can search for respective intermediate frequencies to which the carrier of a QAM DTV signal and the carrier of a VSB DTV signal are to be translated, which frequencies meet the criteria set forth above, by following procedure taught in U.S. Pat. No. 5,506,636. A table of subharmonics of successive harmonics of the 10.76 MHz VSB symbol rate, which the sampling clock rate is harmonically related to, is constructed for the frequency ranges of interest. Then pairs of subharmonics of the same harmonic which exhibit the desired 2.69 MHz difference in frequency between them are considered with regard to their relative advantages as carriers.

The fourth and eighth subharmonics of 21.52 MHz at 5.38 MHz and at 2.39 MHz exhibit substantially the desired 2.69 MHz offset and are appropriate for use as QAM carrier and a VSB carrier with its full sideband above its vestigial sideband in frequency. The 2.69 MHz offset between these subharmonics is one-quarter the symbol rate or 2,690,559.4 Hz, rather than 2,690122.4 Hz offset between the QAM and VSB carriers required to offset the VSB carrier from a co-channel interfering NTSC video carrier by 59.75 times the nominal NTSC horizontal scanning frequency during color transmissions. This small 437 Hz frequency discrepancy is easily accommodated by the automatic frequency and phase control of the controlled local oscillator 16 in the tuner 5 of FIG. 1. The addressing of ROMs 27 and 31 is greatly simplified when the QAM and VSB carriers are translated to be close to the fourth and eighth subharmonics of 21.52 MHz in final IF signals, since advantage can be taken of repetitive symmetries in the stored sine and cosine functions, to reduce ROM address bitwidth.

The second harmonic of the 21.52 MHz sampling frequency is 43.05 MHz, and its subharmonics can be searched, looking for a pair offset from each other in frequency by an amount substantially equal to 2.69 MHz. The eighth and sixteenth subharmonics of 43.05 MHz are the fourth and eighth subharmonics of 21.52 MHz which have already been considered. The tenth and twenty-seventh subharmonics of 43.05 MHz at 4.305 MHz and at 1.594 MHz exhibit a 20 kHz or 0.74% error in regard to the desired 2.69 MHz offset and could respectively serve as QAM carrier and as VSB carrier. This error is within the 30 kHz or so mistuning tolerated in past commercial designs for NTSC TV receivers. The ROM 31 storing sine-cosine lookup tables for the twenty-seventh subharmonic of 43.05 MHz has to store an excessive number of samples, however; and the ROM 27 storing sine-cosine look-up tables for the tenth subharmonic of 43.05 MHz has to store an appreciable number of samples, too.

The third harmonic of the 21.52 MHz sampling frequency is 64.57 MHz, and its subharmonics can be searched, looking for a subharmonic offset in frequency from a subharmonic of 43.05 MHz or from another subharmonic of 64.57 MHz by an amount substantially equal to 2.69 MHz. The thirteenth subharmonic of 64.57 MHz, 4.967 MHz, and the nineteenth subharmonic of 43.05 MHz, 2.265 MHz, exhibit a 12 kHz or 0.45% error in regard to the desired 2.69 MHz offset and could respectively serve as QAM carrier and as a VSB carrier with its full sideband above its vestigial sideband in frequency. This error is well within the 30 kHz or so mistuning tolerated in past commercial designs for NTSC TV receivers. However, the ROM 27 storing sine-cosine look-up tables for the thirteenth subharmonic of 64.57 MHz has to store an excessive number of samples; and the ROM 31 storing sine-cosine look-up tables for the nineteenth subharmonic of 43.05 MHz has to store an excessive number of samples, too.

The eighth subharmonic of 64.57 MHz is 8.07 MHz, offset almost exactly the desired 2.69 MHz from the fourth subharmonic of 21.52 MHz. This fourth subharmonic of 21.52 MHz, 5.38 MHz, and the eighth subharmonic of 64.57

MHz, 8.07 MHz, are appropriate for use as QAM carrier and a VSB carrier with its full sideband below its vestigial sideband in frequency.

It appears preferable that the frequencies of the local oscillators 11, 16 and 20 in the tuner 5 of FIG. 1 be chosen so that the intermediate frequency to which the carrier of a QAM DTV signal is translated is 5.38 MHz, the presumed symbol rate for the QAM DTV signal and half the standard symbol rate for the VSB DTV signal. Accordingly, if the VSB carrier is translated in frequency so as to have its full sideband above its vestigial sideband in frequency in the final IF signal, the preferred frequency of the VSB carrier in the final IF signal is 2.69 MHz. Alternatively, if the VSB carrier is translated in frequency so as to have its full sideband below its vestigial sideband in frequency in the final IF signal, the preferred frequency of the VSB carrier in the final IF signal is 8.07 MHz.

It is noted in passing that all the subharmonics of 43.05 MHz and all the subharmonics of 64.57 MHz are subharmonics of 129.15 MHz, the third harmonic of 43.05 MHz and the second harmonic of 64.57 MHz. The 2.69 MHz, 5.68 MHz and 8.07 MHz frequencies are the forty-eighth, twenty-fourth and sixteenth subharmonics, respectively, of 129.15 MHz. It is also noted that while the harmonic relationship between carriers have been considered in terms of harmonics of the 21.52 MHz sampling rate that is the second harmonic of the 10.76 MHz VSB symbol rate, the consideration thusfar can be viewed as involving the even harmonics of the 10.76 MHz symbol rate. A more complete consideration of the possible harmonic relationships between carriers also includes consideration of odd harmonics, at least third, of the 10.76 MHz VSB symbol rate. The 2.69 MHz, 5.68 MHz and 8.07 MHz frequencies are respectively the twelfth, sixth and fourth subharmonics of 32.29 MHz, 32.29 MHz being three times the 10.76 MHz symbol rate of the VSB signal.

One skilled in the art of designing analog-to-digital conversion circuitry for digital systems will appreciate that the sampling of analog signals for digitization can use various widths of sampling window. Thusfar, it has been presumed that $21.52 * 10^6$ samples per second are taken with the duration of each sampling window extending over half a cycle of 21.52 MHz. The pulses from the limiter 233 can be stretched to nearly twice this duration, if desired. Another alternative that is possible is to design the analog-to-digital converter to use two staggered sets of sampling windows with each sampling window extending over half a cycle of 21.52 MHz and to digitize on a staggered-phase basis at a $43.05 * 10^6$ samples per second combined rate. The digitization of final IF signal at a $43.05 * 10^6$ samples per second improves automatic phase and frequency control accuracy.

Figure 5:
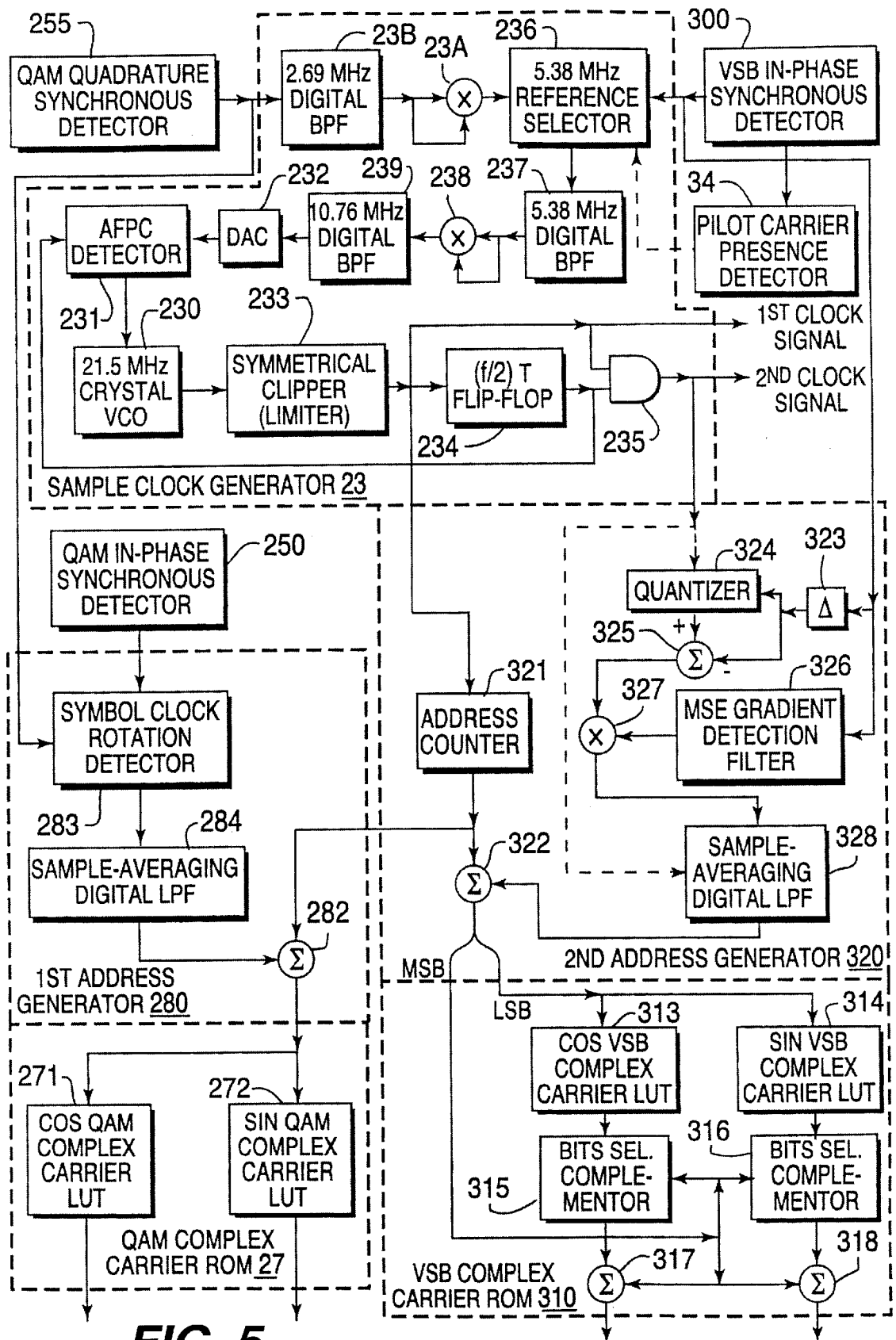
FIG. 5 is a detailed block schematic diagram of circuitry similar to that of FIG. 4, modified so that the address generator for the ROMs supplying digital descriptions of the complex carrier used for synchrodyning digital QAM signals to baseband and the ROMs supplying digital descriptions of the complex carrier used for synchrodyning digital VSB signals to baseband share an address counter in common.

FIG. 5 shows a modification of the FIG. 4 circuitry that is possible when the fourth and the eighth subharmonics of 21.52 MHz are used as the final intermediate frequencies to which the QAM and VSB DTV carriers are respectively converted. In a modification 320 of the second address generator 32 described above, second address counter 321 is arranged to count modulo eight when sampling rate is $21.52 * 10^6$ samples per second, thereby to generate two cycles of ROM 27 addressing and the one cycle of addressing for a ROM 310 that replaces the ROM 31; and the less significant bits of the output count from the second address counter 321 are made available for replacing the basic first address from the first address counter 281. In a modification 280 of the first address generator 28 described above, the first address counter 281 is dispensed with, and the less significant bits of the second address counter 321 are applied to the adder 282 as basic first address instead of the count from the first address counter 281. The VSB complex carrier ROM 31 is replaced with a ROM 310 that comprises a portion 313 that stores only one-half cycle of VSB carrier cosine values and a portion 314 that stores only one-half cycle of VSB carrier sine values. These portions 313 and 314 of the ROM 310 are addressed by the less significant bits of the adder 322 sum output signal. A selective bits complementor 315 exclusive-ORs the most significant bit of the adder 322 sum output signal with each of the bits of the VSB carrier cosine values read from the portion 313 of the ROM 310 for generating a first summand input for a digital adder 317, and the most significant bit of the adder 322 sum output signal is provided with zero extension in the direction of increased significance for generating a second summand input for the adder 317. The sum output from the adder 317 provides the full cycle of VSB carrier cosine values over eight first clock periods. A selective bits complementor 316 exclusive-ORs the most significant bit of the adder 322 sum output signal with each of the bits of the VSB carrier sine values read from the portion 314 of the ROM 310 for generating a first summand input for a digital adder 318, and the most significant bit of the adder 322 sum output signal with zero extension in the direction of increased significance is also applied as a second summand input for the adder 318. The sum output from the adder 318 provides the full cycle of VSB carrier sine values over eight first clock periods.

The FIG. 5 of the FIG. 4 circuitry can also be used when the sixth and fourth subharmonic of 32.29 MHz are used as the final intermediate frequencies to which the QAM and VSB DTV carriers are respectively converted. The contents of the portions 313 and 314 of the ROM 310 are modified for the higher-frequency 8.07 MHz VSB carrier, of course.

One skilled in the art of digital circuit design will understand that other hardware savings can be made in the FIG. 4 read-only memory circuitry taking advantage of symmetries in the cosine and sine functions or the 90° offset in the respective phases of these two functions.

Figure 6:
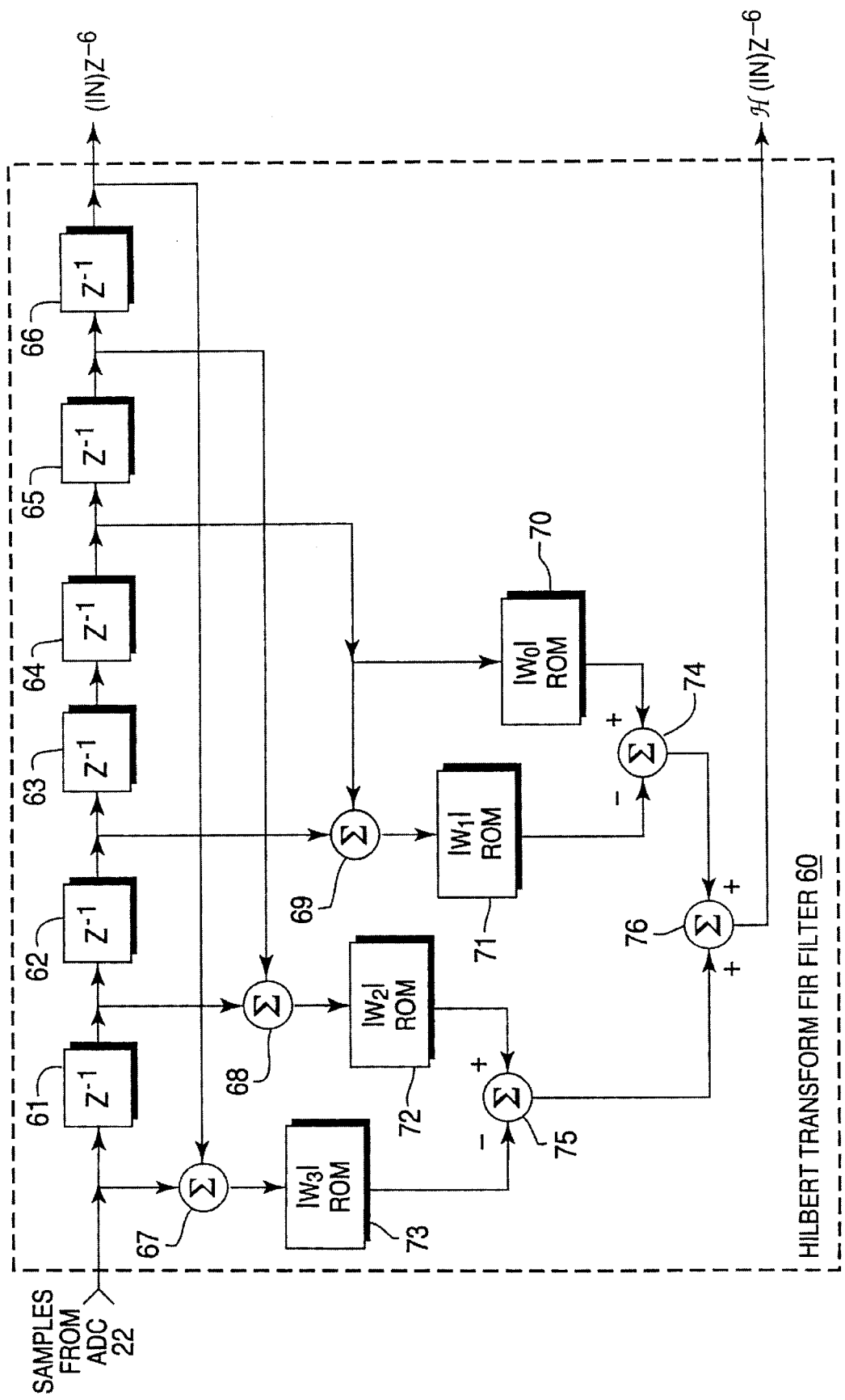
FIG. 6 is a detailed block schematic diagram of circuitry for converting digital samples to complex form in DTV signal radio receivers embodying the invention, which circuitry includes a Hilbert transformation filter for generating imaginary samples from real samples, and which includes delay compensation for the real samples equivalent to the latency of that filter.

FIG. 6 shows a form that the circuitry 24 can take, which comprises:

(a) a linear-phase, finite-impulse-response (FIR) digital filter 60 that generates imaginary (Im) digital samples as a Hilbert transform response to the real (Re) digital samples; and (b) compensating, clocked digital delay of the real digital samples to compensate for the latency time of the Hilbert transformation filter 60, which clocked digital delay can be provided by clocked latch elements 61–66 included in the Hilbert transformation filter 60.

The use of such circuitry for implementing in-phase and quadrature-phase sampling procedures on bandpass signals is described by D. W. Rice and K. H. Wu in their article "Quadrature Sampling with High Dynamic Range" on pp. 736–739 of *IEEE TRANSACTIONS ON AEROSPACE AND ELECTRONIC SYSTEMS*, Vol. AES-18, No. 4 (November 1982). Since the frequency band 6 MHz wide occupied by the final IF signal has a lowest frequency of at least a megaHertz or so, it is possible to use as few as seven non-zero-weighted taps in the FIR filter 60 used for Hilbert transformation.

The seven-tap Hilbert transformation filter 60 includes a cascade connection of one-sample delay elements 61, 62, 63, 64, 65 and 66 from which samples taken to be weighted and summed to generate the Hilbert transform response. The Hilbert transform is linear phase in nature so the tap weights of the FIR filter 60 exhibit symmetry about median delay.

Accordingly, a digital adder 67 sums the input signal to delay element 61 and the output signal from the delay element 66 to be weighted in common, a digital adder 68 sums the output signal from the delay element 61 and the output signal from the delay element 65 to be weighted in common, and a digital adder 69 sums the output signal from the delay element 62 and the output signal from the delay element 64 to be weighted in common. The output signal from the delay element 64 is applied as input address to a read-only memory 70, which multiplies that signal by an appropriate weight $W_0$ magnitude. The sum output signal from the digital adder 69 is applied as input address to a read-only memory 71, which multiplies that signal by an appropriate weight $W_1$ magnitude. The sum output signal from the digital adder 68 is applied as input address to a read-only memory 72, which multiplies that signal by an appropriate weight $W_2$ magnitude. The sum output signal from the digital adder 67 is applied as input address to a read-only memory 73, which multiplies that signal by an appropriate weight $W_3$ magnitude. The use of the ROMs 70, 71, 72 and 73 as fixed-multiplicand multipliers keeps the delay associated with multiplication negligibly short. The output signals of the ROMs 70, 71, 72 and 73 are combined by a tree of signed digital adders 74, 75 and 76 operated as adders or subtractors, as required to appropriately assign signs to the magnitudes of the weights $W_0$, $W_1$, $W_2$ and $W_3$ stored in the ROMs 70, 71, 72 and 73. The adders 67, 68, 69, 74, 75 and 76 are assumed to be clocked adders each exhibiting one-sample latency, which results in the seven-tap FIR filter 60 exhibiting a six-sample latency. Delay of the filter 60 input signal that compensates for this latency is provided by the cascade connection of the six one-sample delay elements 61, 62, 63, 64, 65 and 66. The input address to the read-only memory 70 is taken from the output of the delay element 64, rather than from the output of the delay element 63, so the one-sample delay of delay element 64 compensates for the one-sample delays in the adders 67, 68 and 69.

C. M. Rader in his article "A Simple Method for Sampling In-Phase and Quadrature Components", *IEEE TRANSACTIONS ON AEROSPACE AND ELECTRONIC SYSTEMS*, Vol. AES-20, No. 6 (November 1984), pp. 821–824, describes improvements in complex synchronous detection carried out on digitized bandpass signals. Rader replaces the Hilbert-transform FIR filter and the compensating-delay FIR filter of Rice and Wu with a pair of all-pass digital filters designed based on Jacobian elliptic functions and exhibiting a constant π/2 difference in phase response for the digitized bandpass signals. A preferred pair of such all-pass digital filters, which are of infinite-impulse-response (IIR) type, has the following system functions:

$$H_1(z)=z^{-1}(z^{-2}-a^2)/(1-a^2z^{-2})$$

$$a^2=0.5846832$$

$$H_2(z)=-(z^{-2}-b^2)/(1-b^2z^{-2})$$

$$b^2=0.1380250$$

Rader describes filter configurations which require only two multiplications, one by $a^2$ and one by $b^2$.

Figure 7:
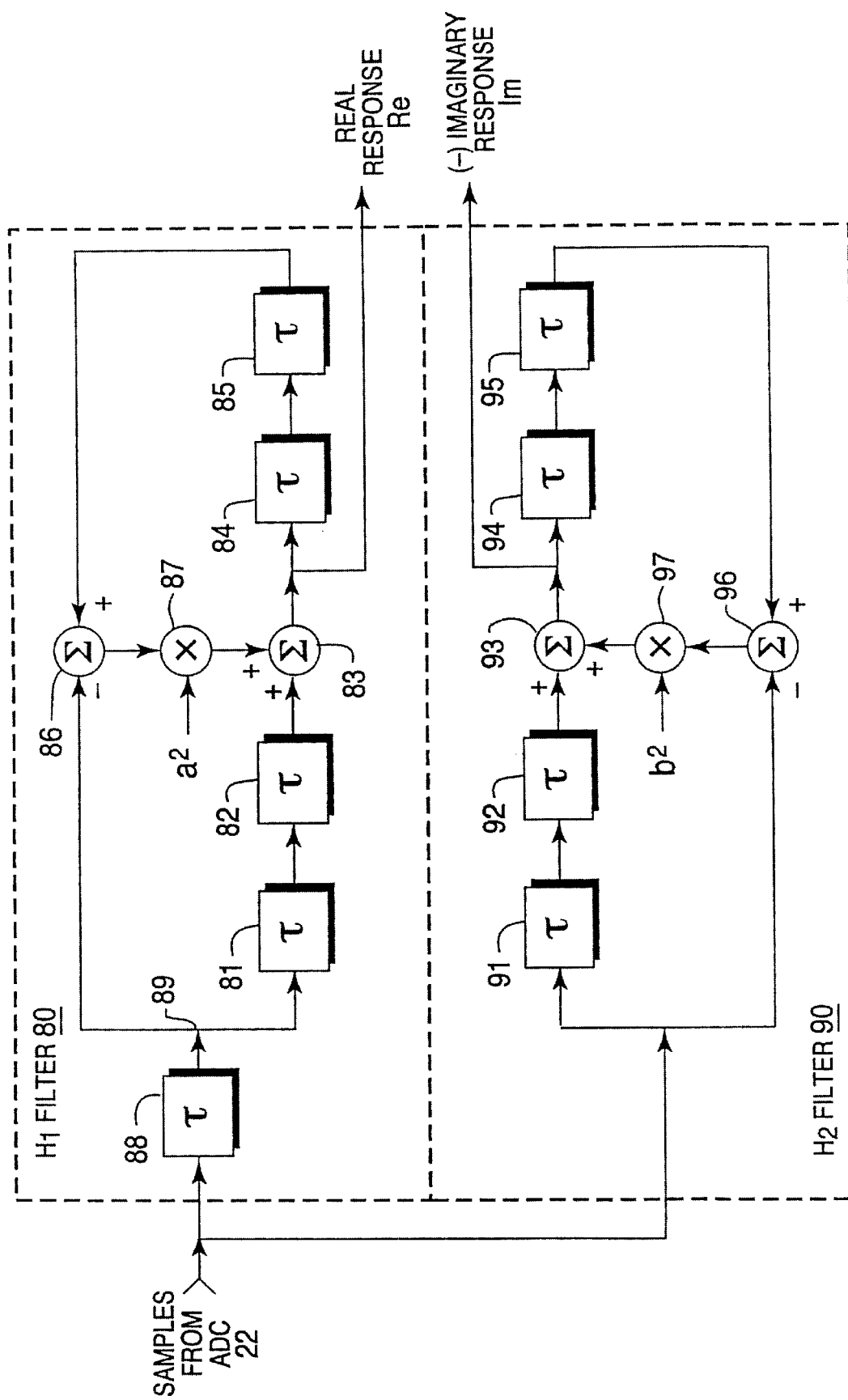
FIG. 7 is a detailed block schematic diagram of a pair of all-pass digital filters of infinite-impulse-response (IIR) type designed based on Jacobian elliptic functions and exhibiting a constant $\pi/2$ difference in phase response for the digitized bandpass signals, as can be employed for converting digital samples to complex form in DTV signal radio receivers embodying the invention.

FIG. 7 shows an alternative form that the circuitry 24 can take, which comprises a pair of all-pass digital filters 80 and 90 of a type described by C. M. Rader and designed based on Jacobian elliptic functions. The filters 80 and 90 exhibit a constant π/2 difference in phase response for digitized bandpass signals. Since oversampled real samples better provide for symbol synchronization when synchrodyning VSB signals, the inventors prefer not to use the all-pass filters described by Rader that exploit sub-sampling to provide further reductions in the delay network circuitry.

The construction of the filter 80, which provides the system function $H_1(z)=z^{-1}(Z^{-2}-a^2)/(1-a^2z^{-2})$, where $a^2=0.5846832$ in decimal arithmetic, is shown in FIG. 7 to be as follows. The samples from the ADC 22 are delayed by one ADC sample clock duration in a clocked delay element 88 for application to a node 89. The signal at node 89 is further delayed by two ADC sample clock intervals in cascaded clocked delay elements 81 and 82, for application as first summand signal to a digital adder 83. The sum output signal of the adder 83 provides the real response from the filter 80. The sum output signal of the adder 83 is delayed by two ADC sample clock durations in cascaded clocked delay elements 84 and 85, for application as minuend input signal to a digital subtractor 86 that receives the signal at node 89 as its subtrahend input signal. The resulting difference output signal from the digital subtractor 86 is supplied as multiplier input signal to a digital multiplier 87 for multiplying an $a^2$ multiplicand signal, using a binary arithmetic. The resulting product output signal is applied to the digital adder 83 as its second summand signal.

The construction of the filter 90, which provides the system function $-H_2(z)=(z^{-2}-b^2z^{-2})/(1-b^2z^{-2})$, where $b^2=0.1380250$ in decimal arithmetic, is shown in FIG. 7 to be as follows. The samples from the ADC 22 are delayed by two ADC sample clock epochs in cascaded clocked delay elements 91 and 92, for application as first summand signal to a digital adder 93. The sum output signal of the adder 93 provides the imaginary response from the filter 90. The sum output signal of the adder 93 is delayed by two ADC sample clock epochs in cascaded clocked delay elements 94 and 95, for application to a digital subtractor 96 as its minuend signal. The subtractor 96 receives the samples from the ADC 22 as its subtrahend input signal. The resulting difference output signal from the digital subtractor 96 is supplied as multiplier input signal to a digital multiplier 97 for multiplying a $b^2$ multiplicand signal, using a binary arithmetic. The resulting product output signal is applied to the digital adder 93 as its second summand signal.

Figure 8:
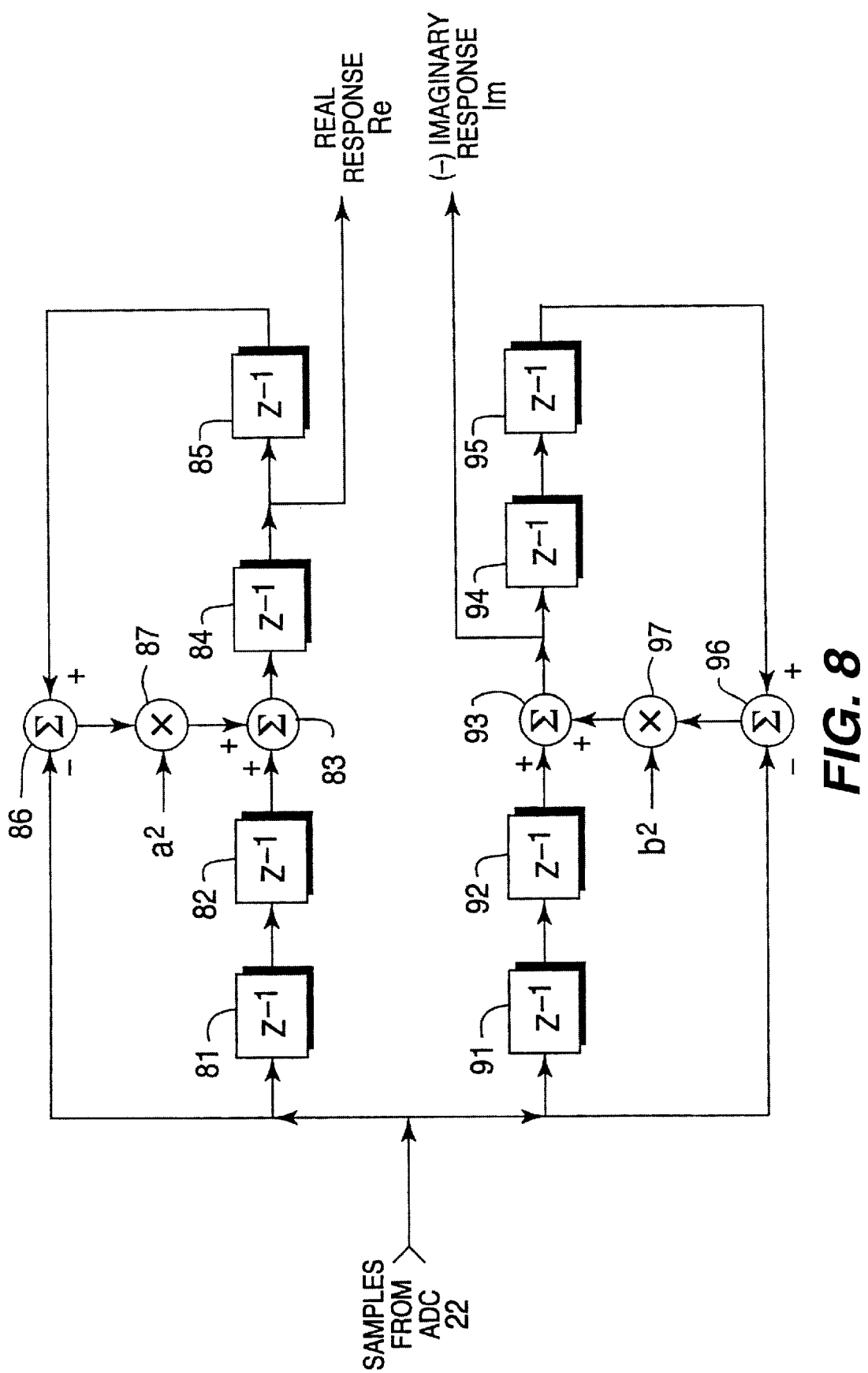
FIGS. 8 and 9 are block schematic diagrams of changes that can be made to the filter circuitry of FIG. 7 to remove redundant delay.

FIG. 8 shows a complex-signal filter resulting from modifying the FIG. 7 complex-signal filter as follows. The position of the clocked delay element 88 is shifted so as to delay the sum output signal of the adder 83, rather than to delay the digital output signal of the ADC 22, and the digital output signal of the ADC 22 is applied to the node 89 without delay, thereby to cause real response to be provided at the output port of the shifted-in-position clocked delay element 88. The real response provided at the output port of the shifted-in-position clocked delay element 81 is the same as the response provided at the output port of the clocked delay element 84. So, the real response is provided from the output port of the clocked delay element 84 instead of from the output port of the shifted-in-position clocked delay element 81; and the shifted-in-position clocked delay element 81, being no longer required, is dispensed with.

Figure 9:
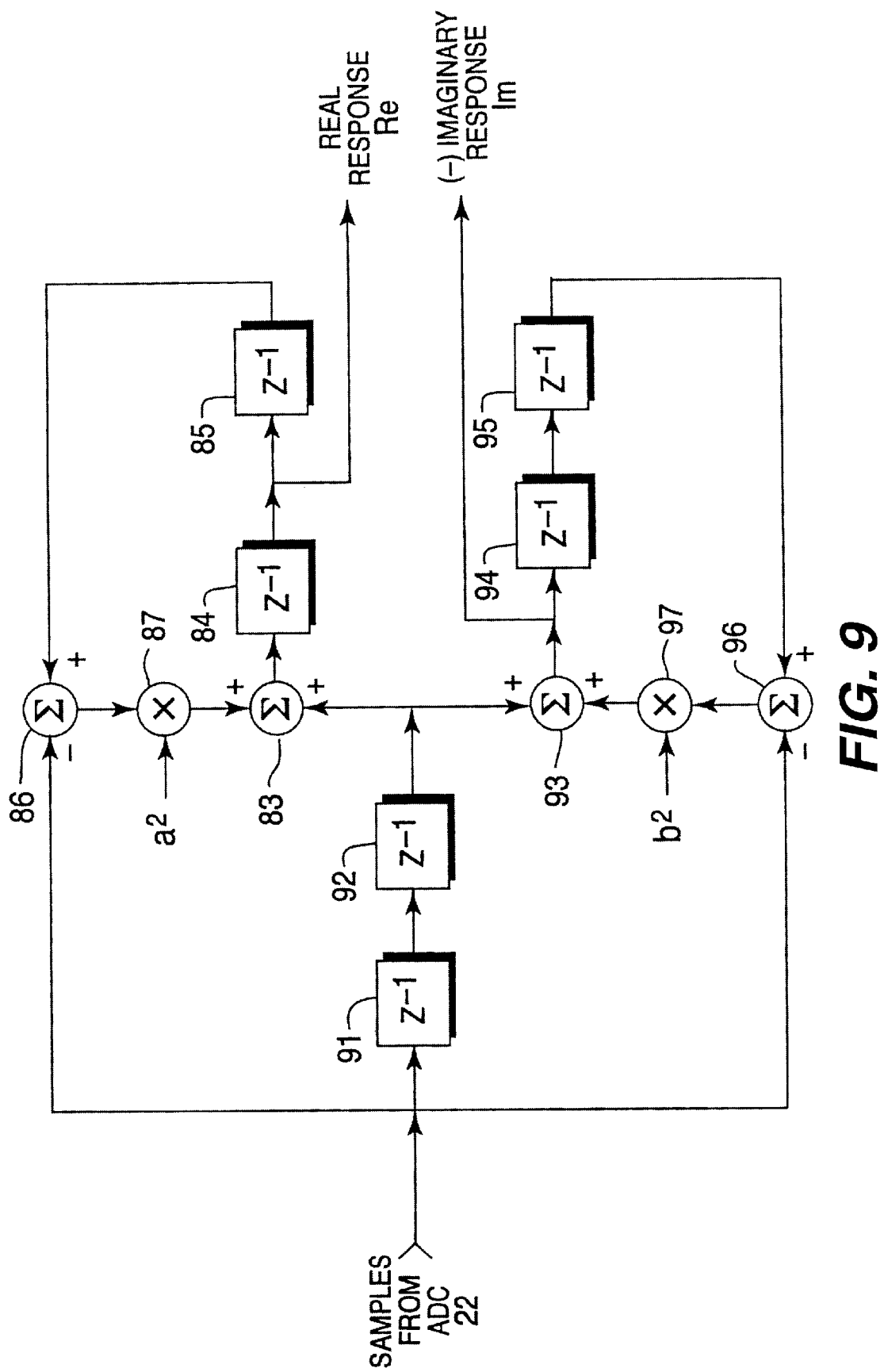

FIG. 9 shows a complex-signal filter resulting from modifying the FIG. 8 complex-signal filter as follows. The first summand signal for the adder 83 is then taken from the cascaded clocked delay elements 91 and 92, rather than from the cascaded clocked delay elements 81 and 82. The cascaded clocked delay elements 81 and 82, being no longer required, are dispensed with. The FIG. 9 complex-signal filter is preferred over the complex-signal filters of FIGS. 7 and 8 in that redundant clocked delay elements are eliminated.

Figure 10:
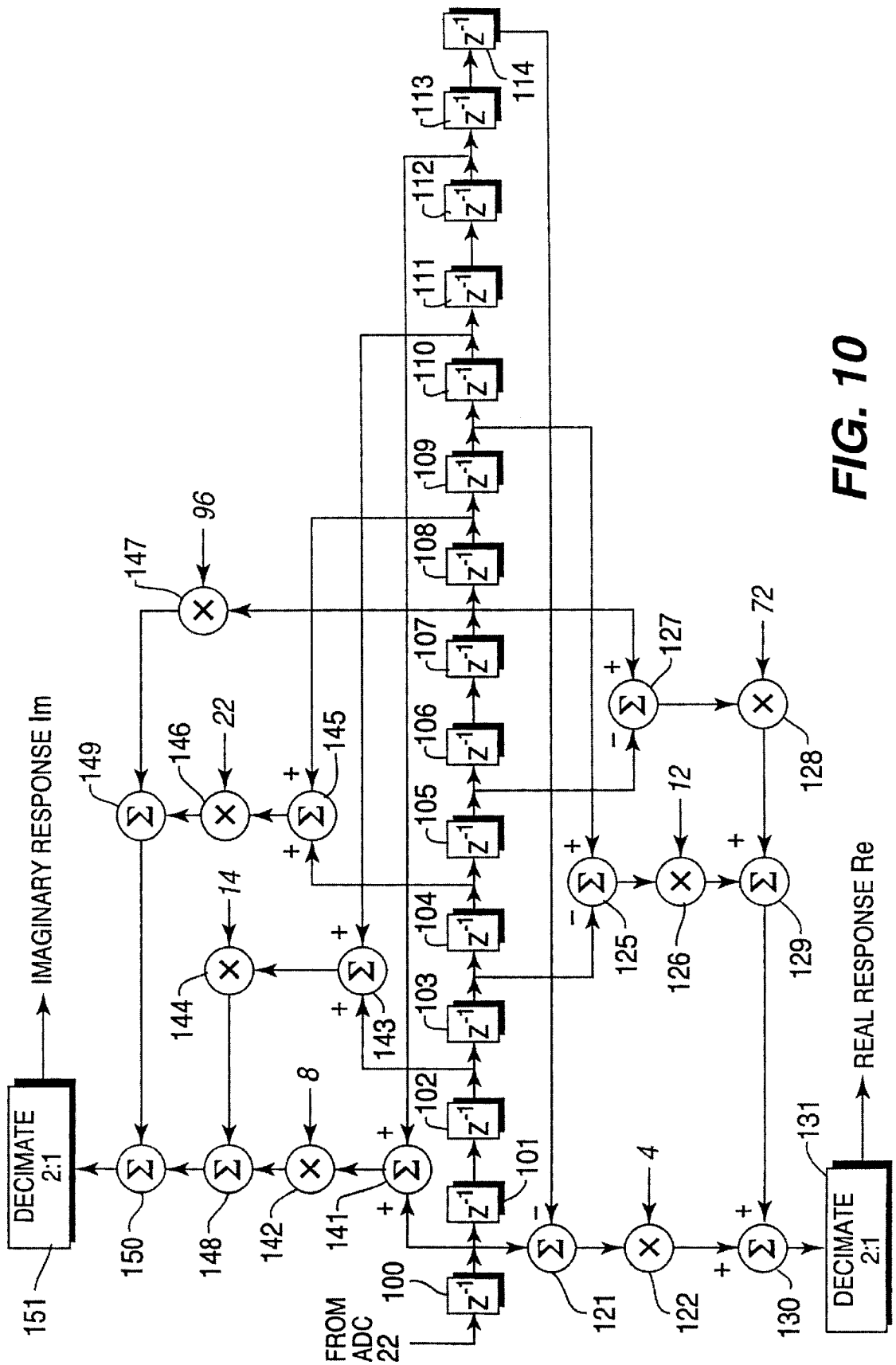
FIG. 10 is a detailed block schematic diagram of a pair of all-pass digital filters of finite-impulse-response (FIR) type exhibiting a constant $\pi/2$ difference in phase response for the digitized bandpass signals, as can be employed for converting digital samples to complex form in DTV signal radio receivers embodying the invention.

FIG. 10 is a detailed block schematic diagram of a complex-signal filter developing a constant π/2 difference in phase between a real response Re and an imaginary response Im to the digitized bandpass signals, that is similar the complex-signal filter described by T. F. S. Ng in United Kingdom patent application 2 244 410 A published Nov. 27, 1991 and entitled QUADRATURE DEMODULATOR. The Ng filters are finite-impulse-response (FIR) digital filters, rather than IIR filters as described by Rader. The FIG. 10 complex-signal filter differs from the filters described by Ng in that 2:1 decimation is done following filtering, rather than before.

This permits the real and imaginary filtering to be supported by a shared tapped delay line. FIG. 10 shows this shared tapped delay line composed of cascaded single-clock-delay elements 100–114, such as latches that like the ADC 22 are clocked at four times symbol transmission rate. The single-clock-delay element 100 may be dispensed with or subsumed into the ADC 22 in some designs. Digital adders and subtractors in the FIG. 6 complex filter are assumed to be clocked at four times symbol transmission rate, with each having a single-clock-duration latency. The digital multipliers are assumed to be a wired place shift in the case of a multiplication by an integral power of two or to be provided from read-only memory (ROM), so there is zero latency in each multiplication insofar as clocked operation is concerned. At least the eight-bit resolution in the filter results per Ng is presumed.

In order to generate the real response $H_1(z)$, the real-response filter is presumed to apply tap weights $W_0=4$, $W_1=0$, $W_2=-12$, $W_3=-72$, $W_4=72$, $W_5=12$, $W_6=0$ and $W_7=-4$ per the example described by Ng. The real-response filter, in addition to the single-clock-delay elements 100–114, includes a digital subtractor 121 for subtracting the response of the delay element 114 from the response of the delay element 100, a digital multiplier 122 for weighting the differential response of the subtractor 121 by a factor of four, a digital subtractor 125 for subtracting the response of the delay element 103 from the response of the delay element 109, a digital multiplier 126 for weighting the differential response of the subtractor 125 by a factor of twelve, a digital subtractor 127 for subtracting the response of the delay element 105 from the response of the delay element 107, a digital multiplier 128 for weighting the differential response of the subtractor 127 by a factor of seventy-two, a digital adder 129 for summing the products from the digital multipliers 126 and 128, a digital adder 130 for summing the product from the digital multiplier 122 with the sum output signal from the adder 129, and a 2:1 decimator 131 for generating the real filter response Re in decimated response to the sum output signal from the adder 130.

The subtractor 121 subtracts the response of the delay element 114 from the response of the delay element 100, rather than subtracting the response of the delay element 113 from the output signal of the ADC 22, to introduce single-clock-duration delay to compensate for the latency of the adder 129. Since $W_1=0$ and $W_6=0$, there is no digital subtractor 123 for subtracting the response of the delay element 111 from the response of the delay element 101 or digital multiplier 124 for weighting the differential response of the subtractor 123. Consequently, there is no digital adder for summing product from the multiplier 124 with the product from the multiplier 122. This gives rise to the need to compensate for the latency of the adder 129.

In order to generate the imaginary response $H_1(z)$, the imaginary-response filter is presumed to apply tap weights $W_8=8$, $W_9=14$, $W_{10}=22$, $W_{11}=96$, $W_{12}=22$, $W_{13}=14$, $W_{14}=8$ corrected from the example described by Ng. The imaginary-response filter, in addition to the single-clock-delay elements 100–112, includes a digital adder 141 for adding the response of the delay element 112 with the response of the delay element 100, a digital multiplier 142 for weighting the sum response of the adder 141 by a factor of eight, a digital adder 143 for adding the response of the delay element 110 with the response of the delay element 102, a digital multiplier 144 for weighting the sum response of the adder 143 by a factor of fourteen, a digital adder 145 for adding the response of the delay element 108 with the response of the delay element 104, a digital multiplier 146 for weighting the sum response of the adder 145 by a factor of twenty-two, a digital multiplier 147 for weighting the response of the delay element 107 by a factor of ninety-six, a digital adder 148 for summing the products from the digital multipliers 142 and 144, a digital adder 149 for summing the products from the digital multipliers 146 and 147, a digital adder 150 for summing the sum output signals from the adders 148 and 149, and a 2:1 decimator 151 for generating the imaginary filter response Im in decimated response to the sum output signal from the adder 150.

The digital multiplier 147 weights the response of the delay element 107 by a factor of ninety-six, rather than the response of the delay element 106, in order to introduce single-clock-duration delay to compensate for the single-clock-duration latency of each of the adders 141 143 and 145.

Figure 13:
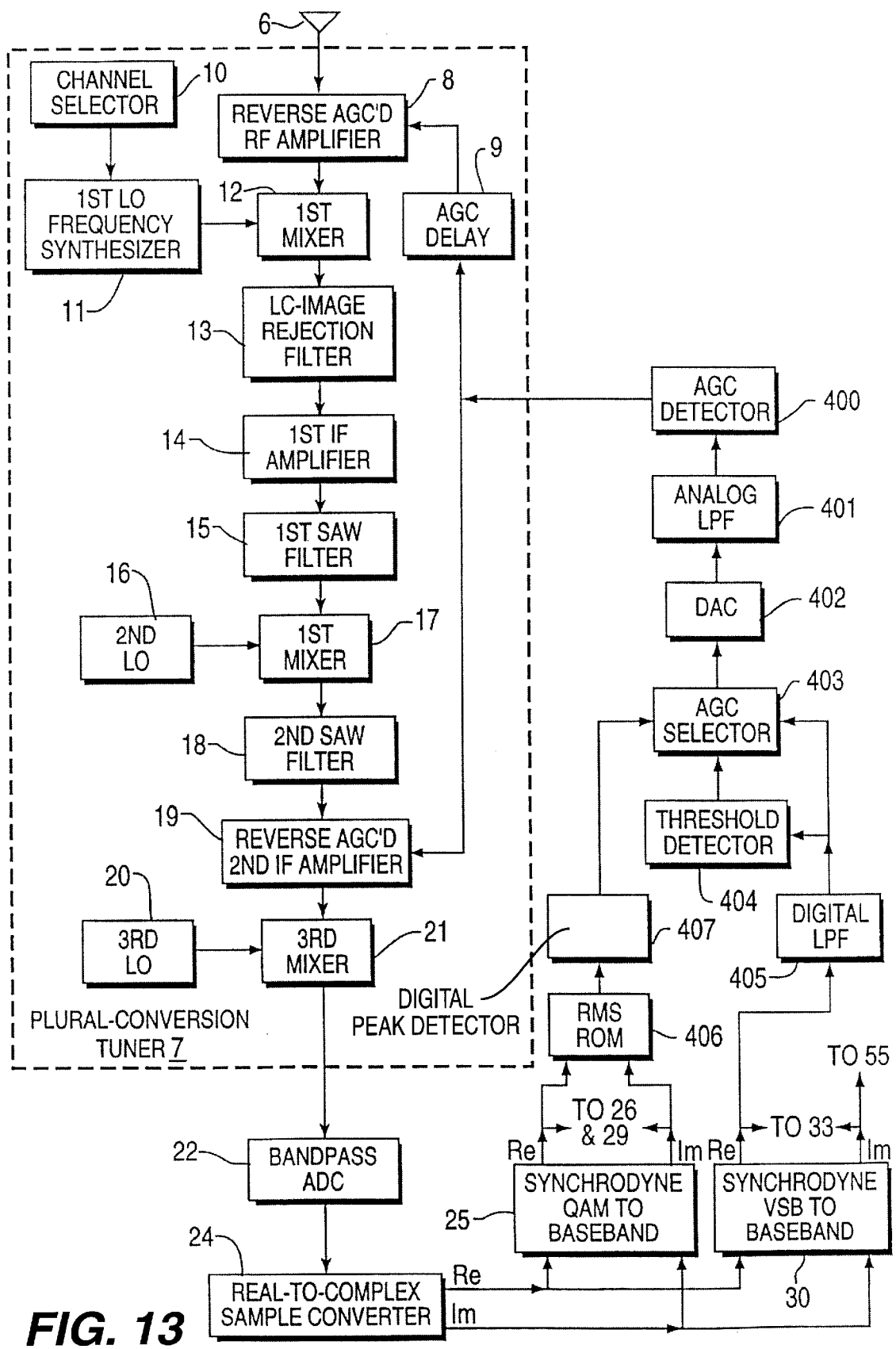
FIG. 13 is a block schematic diagram illustrating how, in accordance with aspects of the invention, automatic gain control is provided to a DTV signal receiver.

FIG. 13 illustrates how automatic gain control is provided to a tuner 7 within a DTV signal receiver embodying aspects of the invention. The DTV signal receiver is presumed to be generally similar to those described earlier in this specification except for the tuner 5, not shown as having a radio-frequency amplifier, being replaced by the tuner 7 having a radio-frequency amplifier 8 that has reverse automatic gain control. The radio-frequency amplifier 8 has delayed automatic gain control and receives its automatic gain control signal from an automatic gain control delay circuit 9. The AGC delay circuit 9 responds to an automatic gain control signal that is also applied to the second IF amplifier 19, stages of which have reverse automatic gain control.

This automatic gain control signal is supplied from an automatic gain control detector 400, which peak detects the response of an analog lowpass filter 401 used to smooth the response of a digital-to-analog converter 402. The DAC 402 receives a digital automatic gain control signal from one of two sources, as selected by an AGC selector 403 in response to a control bit supplied from a digital threshold detector 404. The AGC selector 403 is a digital multiplexer as may be constructed from two banks of tri-states respectively controlled by a control bit and by the one's complemented control bit. A digital lowpass filter 405 supplies a response of a few hertz bandwidth to the real samples supplied from the VSB synchrodyning circuitry 30 to detect the amplitude of the pilot carrier of a VSB DTV signal.

The digital threshold detector 404 is a digital comparator. It responds to the amplitude of the pilot carrier, as so detected, exceeding a prescribed digital threshold value to supply a control bit of a state indicative that a VSB DTV signal is being received. If the amplitude of the pilot carrier as so detected does not exceed a prescribed digital threshold value, the control bit supplied from the digital threshold detector 404 is of an alternative state indicative that a VSB DTV signal is not being received. The lowpass filter 405 and threshold detector 404 cooperate to provide the VSB pilot carrier presence detector 34 of FIG. 1.

If the control bit supplied from the digital threshold detector 404 is of the state indicative that a VSB DTV signal is being received, this control bit conditions the AGC selector 403 to select the lowpass filter 405 response to the DAC 402, to serve as the basis from which the AGC detector 400 generates AGC signal for application to the AGC delay circuit 9 and to the second IF amplifier 19. Alternatively, if the control bit supplied from the digital threshold detector 404 is of the state indicative that a VSB DTV signal is not being received, this control bit conditions the AGC selector 403 to select an indication of QAM DTV signal level to the DAC 402, to serve as the basis from which the AGC detector 400 generates AGC signal for application to the AGC delay circuit 9 and to the second IF amplifier 19.

An indication of QAM DTV signal level can be generated in response to the peak value of the root-mean-square value of the complex baseband signal generated by the QAM synchrodyning circuitry 25, along the general lines described by T. M Wagner et alii in U.S. patent Ser. No. 5,235,424 issued Aug. 10, 1993, entitled AUTOMATIC GAIN CONTROL SYSTEM FOR A HIGH DEFINITION TELEVISION RECEIVER. A read-only memory 406 is used to determine the root-mean-square value of the complex baseband signal generated by the QAM synchrodyning circuitry 25. A digital peak detector 407 detects the peak value of the ROM 46 response over an interval.in which the data randomizer maintains QAM levels random. The digital peak detector 407 can include a digital comparator for comparing the current value of the ROM 46 read-out with a previous value stored in temporary storage register and selecting the larger of the two values to update the temporary storage register and to provide the peak detector 407 output response. The ROM 46 can be replaced by equivalent digital circuitry such as circuitry comprising respective squarers for the real and imaginary components of the complex baseband signal generated by the QAM synchrodyning circuitry 25, a digital adder for summing the squares supplied by the squarers, and a read-only memory for extracting the root of the sum signal supplied from the adder. A variant of this alternative omits the read-only memory for extracting the root of the sum signal supplied from the adder. Instead, the sum signal supplied from the adder is supplied to the AGC selector 403 as the indication of QAM DTV signal level; and the response of the digital lowpass filter 405 is squared before being supplied to the AGC selector 403 as the indication of VSB DTV signal level.

Circuitry for generating an indication of QAM DTV signal level that is less susceptible to error due to impulse noise than that described by T. M Wagner et alii is disclosed by A. L. R. Limberg in U.S. Pat. No. 5,805,241 entitled "NOISE-IMMUNE AUTOMATIC GAIN CONTROL FOR QAM RADIO RECEIVERS" and issued Aug. 9, 1998 pursuant to U.S. patent application Ser. No. 08/857,065 filed May 15, 1997 claiming priority from U.S. provisional application Ser. No. 60/018,017 filed May 21, 1996. The baseband signals from the QAM synchrodyning circuitry 25 are differentiated, and gain control signals are derived from histogram storage of the amplitudes of differentiation results. The amplitudes of differentiation results that are not frequently repeated are deleted when calculating automatic gain control signal, to eliminate from the calculations those amplitudes of differentiation results generated in response to impulse noise. The Limberg AGC circuitry for QAM reception is readily adapted to the needs of the present invention.

Other variants of AGC detector circuitry for DTV receivers are disclosed by the inventors in U.S. Pat. No. 5,636,252 entitled "AUTOMATIC GAIN CONTROL OF RADIO RECEIVER FOR RECEIVING DIGITAL HIGH-DEFINITION TELEVISION SIGNALS" and issued 3 June pursuant to U.S. patent application Ser. No. 08/573,454 filed Dec. 15, 1995.

In DTV receivers that are designed only for receiving VSB DTV signals, the elements 403, 404, 406 and 407 of FIG. 13 are omitted; and the response of the digital lowpass filter 405 is supplied directly to the DAC 402. The QAM synchrodyning circuitry 25 of FIGS. 1, 3 and 13 is omitted together with related circuitry having to do only with QAM DTV reception. During the period of transition from analog TV broadcasting to DTV broadcasting, in a DTV receiver without QAM reception capability it is advantageous to replace the 6-MHz-wide SAW filter 15 with a SAW filter of narrower bandwidth that rejects the NTSC sound carrier. The synchrodyne result selector 33 and AFPC selector 55 of FIG. 1 are omitted in a DTV receiver without QAM reception capability. The QAM two-dimensional trellis decoder 37, the data source selector 39, the first data synchronization recovery circuitry 44 and the data sync selector 46 of FIG. 2 are also omitted, of course. It is also possible in a further modification to eliminate the digital lowpass filter 405 and supply the real baseband signal from the VSB synchrodyning circuitry 30 directly to the DAC 402.

Television engineers are currently considering using the digital transmission system for HDTV for transmitting other types of television signals—for example, four television signals with resolution similar to present-day NTSC signals that are simultaneously transmitted. The invention is suitable for use in receivers for these alternative transmission schemes, and the claims which follow should be construed broadly enough to include such receivers within their scope.

In the claims which follow, the word "said" is used whenever reference is made to an antecedent, and the word "the" is used for grammatical purposes other than to refer back to an antecedent.

What is claimed is:

1. Apparatus for reproducing data transmitted by amplitude-modulation of a carrier by multi-level symbol code sequences, said apparatus comprising:

a tuner, for selecting said carrier amplitude-modulated by multi-level symbol code sequences and converting the frequencies thereof to generate a final intermediate-frequency signal, said tuner including a local oscillator for supplying local oscillations used in converting the frequencies of said carrier amplitude-modulated by multi-level symbol code sequences, said local oscillations being of a frequency and phase that is controlled in response to an automatic-frequency-and-phase-control signal applied to said local oscillator;

a sample clock generator for generating sample clock signals;

an analog-to-digital converter for digitizing samples of said final intermediate-frequency signal taken in response to said sample clock signals, thereby to generate samples of a digitized final intermediate-frequency signal;

digital synchrodyning circuitry responsive to said digitized final intermediate-frequency signal for generating a digital in-phase baseband signal and a digital quadrature-phase baseband signal, by synchrodyning said digitized final intermediate-frequency signal to baseband;

circuitry for generating a lowpass filter response to said digital quadrature-phase baseband signal, which said lowpass filter response is applied to said local oscillator as said automatic frequency and phase control signal, thereby completing a feedback loop that adjusts said local oscillations for causing said digital in-phase baseband signal to be descriptive of transmitted multi-level symbol code; and symbol decoding circuitry, responsive to said multi-level symbol code sequences as reproduced in said digital in-phase baseband signal, for reproducing the transmitted data.

2. The apparatus of claim 1, wherein said digital synchrodyning circuitry comprises:

circuitry for supplying an imaginary portion as well as a real portion of a complex digitized final intermediate-frequency signal;

read-only memory for storing descriptions of a digital carrier for synchrodyning with said final intermediate-frequency signal and for supplying digital samples of said digital carrier in first and second phases mutually orthogonal to each other responsive to successive values of memory addressing;

a counter for counting sample clock signals to generate at least a component of said memory addressing;

a first digital multiplier for multiplying said real portion of said complex digitized final intermediate-frequency signal by digital samples of the first phase of said digital carrier to generate a digital first partial product signal;

a second digital multiplier for multiplying said imaginary portion of said complex digitized final intermediate-frequency signal by digital samples of the second phase of said digital carrier to generate a digital second partial product signal;

a third digital multiplier for multiplying said real portion of said complex digitized final intermediate-frequency signal by digital samples of the second phase of said digital carrier to generate a digital third partial product signal;

a fourth digital multiplier for multiplying said imaginary portion of said complex digitized final intermediate-frequency signal by digital samples of the first phase of said digital carrier to generate a digital fourth partial product signal;

circuitry for combining said digital first and second partial product signals to generate said digital in-phase baseband signal; and circuitry for combining said digital third and fourth partial product signals to generate said digital quadrature-phase baseband signal.

3. The apparatus of claim 2, wherein said circuitry for supplying an imaginary portion as well as a real portion of a complex digitized final intermediate-frequency signal comprises:

delay circuitry for supplying said real portion of said complex digitized final intermediate-frequency signal in delayed response to said digitized final intermediate-frequency signal supplied from said analog-to-digital converter, and further circuitry implementing a Hilbert transform filter for supplying said imaginary portion of said complex digitized final intermediate-frequency signal in response to said digitized final intermediate-frequency signal supplied from said analog-to-digital converter, the delay in the delayed response of the delay circuitry corresponding to the latent delay in said Hilbert transform filter.

4. The apparatus of claim 3, wherein said tuner is designed for converting the frequencies of said digital television signal to a final intermediate-frequency signal offset from zero frequency by at least a few hundred kilohertz, which facilitates construction of said Hilbert transform filter.

5. The apparatus of claim 2, wherein said circuitry for supplying an imaginary portion as well as a real portion of a complex digitized final intermediate-frequency signal comprises:

first and second infinite-impulse-response filters respectively supplying said real and imaginary portions of said complex digitized final intermediate-frequency as their respective responses to said digitized final intermediate-frequency signal supplied from said analog-to-digital converter.

6. The apparatus of claim 5, wherein said tuner is designed for converting the frequencies of said digital television signal to a final intermediate-frequency signal offset from zero frequency by at least a few hundred kilohertz, which facilitates construction of said first and second infinite-impulse-response filters.

7. The apparatus of claim 2, wherein said circuitry for supplying an imaginary portion as well as a real portion of a complex digitized final intermediate-frequency signal comprises:

first and second finite-impulse-response filters respectively supplying said real and imaginary portions of said complex digitized final intermediate-frequency as their respective responses to said digitized final intermediate-frequency signal supplied from said analog-to-digital converter.

8. The apparatus of claim 7, wherein said tuner is designed for converting the frequencies of said digital television signal to a final intermediate-frequency signal offset from zero frequency by at least a few hundred kilohertz, which facilitates construction of said first and second finite-impulse-response filters.

9. The apparatus of claim 2, wherein said tuner is designed for converting the frequencies of said digital television signal to a final intermediate-frequency signal offset from zero frequency by at least a few hundred kilohertz.

10. The apparatus of claim 2, wherein said digital synchrodyning circuitry is vestigial-sideband digital synchrodyning circuitry arranged for demodulating a digitized final intermediate-frequency signal descriptive of vestigial sideband amplitude-modulation of said carrier.

11. The apparatus of claim 1, wherein said digital synchrodyning circuitry is vestigial-sideband digital synchrodyning circuitry arranged for demodulating a digitized final intermediate-frequency signal descriptive of vestigial-sideband amplitude-modulation of said carrier.

12. The apparatus of claim 11, wherein said symbol decoding circuitry comprises a trellis decoder for generating trellis decoding results responsive to said digital in-phase baseband signal.

13. The apparatus of claim 12, further including:

an equalizer connected for receiving as input signal thereto said digital in-phase baseband signal from said digital synchrodyning circuitry and for supplying an equalizer response to said trellis decoder as input signal thereof.

14. The apparatus of claim 12, wherein said symbol decoding circuitry further comprises:

a data de-interleaver for de-interleaving said trellis decoding results to generate de-interleaver results;

a Reed-Solomon decoder responsive to said de-interleaver results to reproduce error-corrected randomized data; and a data de-randomizer for de-randomizing said error-corrected randomized data to reproduce said transmitted data.

15. The apparatus of claim 14, further including:

an equalizer connected for receiving as input signal thereto said digital in-phase baseband signal from said digital synchrodyning circuitry and for supplying an equalizer response to said trellis decoder as input signal thereof.

16. The apparatus of claim 12, wherein some portions of said transmitted data reproduced by said symbol decoding circuitry describe a compressed digital video signal in packet form, and wherein other portions of said transmitted data reproduced by said symbol decoding circuitry describe a compressed digital audio signal in packet form.

17. The apparatus of claim 16, further including:

an equalizer connected for receiving as input signal thereto said digital in-phase baseband signal from said digital synchrodyning circuitry and for supplying an equalizer response to said trellis decoder as input signal thereof.

18. The apparatus of claim 16, further comprising:

a digital sound decoder for decoding said compressed digital audio signal to generate at least one decompressed audio signal that is analog in character;

a digital video decoder for decoding said compressed digital video signal to generate at least one decompressed video signal that is analog in character; and a packet sorter, for selecting as input signal to said digital sound decoder said portions of said transmitted data reproduced by said symbol decoding circuitry that describe a compressed digital video signal in packet form, and for selecting as input signal to said digital video decoder said portions of said transmitted data reproduced by said symbol decoding circuitry that describe a compressed digital video signal in packet form.

19. The apparatus of claim 18 wherein, at least at times, said digital signals are descriptive of red, green and blue video signals.

20. The apparatus of claim 18, further including:

an equalizer connected for receiving as input signal thereto said digital in-phase baseband signal from said digital synchrodyning circuitry and for supplying an equalizer response to said trellis decoder as input signal thereof.

21. The apparatus of claim 12, wherein said vestigial-sideband digital synchrodyning circuitry comprises:

circuitry for supplying an imaginary portion as well as a real portion of a complex digitized final intermediate-frequency signal;

read-only memory for storing digital descriptions of a carrier to synchrodyne with said final intermediate-frequency signal, said carrier being of a frequency offset from the middle of the intermediate-frequency signal spectrum, and for supplying digital samples of said digital carrier in first and second phases mutually orthogonal to each other responsive to successive values of memory addressing;

a counter for counting sample clock signals to generate at least a component of said memory addressing;

a first digital multiplier for multiplying said real portion of said complex digitized final intermediate-frequency signal by digital samples of the first phase of said digital carrier to generate a digital first partial product signal;

a second digital multiplier for multiplying said imaginary portion of said complex digitized final intermediate-frequency signal by digital samples of the second phase of said digital carrier to generate a digital second partial product signal;

a third digital multiplier for multiplying said real portion of said complex digitized final intermediate-frequency signal by digital samples of the second phase of said digital carrier to generate a digital third partial product signal;

a fourth digital multiplier for multiplying said imaginary portion of said complex digitized final intermediate-frequency signal by digital samples of the first phase of said digital carrier to generate a digital fourth partial product signal;

circuitry for combining said digital first and second partial product signals to generate said digital in-phase baseband signal; and circuitry for combining said digital third and fourth partial product signals to generate said digital quadrature-phase baseband signal.

22. The apparatus of claim 21, wherein said circuitry for supplying an imaginary portion as well as a real portion of a complex digitized final intermediate-frequency signal comprises:

delay circuitry for supplying said real portion of said complex digitized final intermediate-frequency signal in delayed response to said digitized final intermediate-frequency signal supplied from said analog-to-digital converter, and further circuitry implementing a Hilbert transform filter for supplying said imaginary portion of said complex digitized final intermediate-frequency signal in response to said digitized final intermediate-frequency signal supplied from said analog-to-digital converter, the delay in the delayed response of the delay circuitry corresponding to the latent delay in said Hilbert transform filter.

23. The apparatus of claim 22, wherein said tuner is designed for converting the frequencies of said digital television signal to a final intermediate-frequency signal offset from zero frequency by at least a few hundred kilohertz, which facilitates construction of said Hilbert transform filter.

24. The apparatus of claim 21, wherein said circuitry for supplying an imaginary portion as well as a real portion of a complex digitized final intermediate-frequency signal comprises:

first and second infinite-impulse-response filters respectively supplying said real and imaginary portions of said complex digitized final intermediate-frequency as their respective responses to said digitized final intermediate-frequency signal supplied from said analog-to-digital converter.

25. The apparatus of claim 24, wherein said tuner is designed for converting the frequencies of said digital television signal to a final intermediate-frequency signal offset from zero frequency by at least a few hundred kilohertz, which facilitates construction of said first and second infinite-impulse-response filters.

26. The apparatus of claim 21, wherein said circuitry for supplying an imaginary portion as well as a real portion of a complex digitized final intermediate-frequency signal comprises:

first and second finite-impulse-response filters respectively supplying said real and imaginary portions of said complex digitized final intermediate-frequency as their respective responses to said digitized final intermediate-frequency signal supplied from said analog-to-digital converter.

27. The apparatus of claim 26, wherein said tuner is designed for converting the frequencies of said digital television signal to a final intermediate-frequency signal offset from zero frequency by at least a few hundred kilohertz, which facilitates construction of said first and second finite-impulse-response filters.

28. The apparatus of claim 21, further including:
an equalizer connected for receiving as input signal thereto said digital in-phase baseband signal from said digital synchrodyning circuitry and for supplying an equalizer response to said trellis decoder as input signal thereof.

29. The apparatus of claim 28, wherein said circuitry for supplying an imaginary portion as well as a real portion of a complex digitized final intermediate-frequency signal comprises:
delay circuitry for supplying said real portion of said complex digitized final intermediate-frequency signal in delayed response to said digitized final intermediate-frequency signal supplied from said analog-to-digital converter, and
further circuitry implementing a Hilbert transform filter for supplying said imaginary portion of said complex digitized final intermediate-frequency signal in response to said digitized final intermediate-frequency signal supplied from said analog-to-digital converter, the delay in the delayed response of the delay circuitry corresponding to the latent delay in said Hilbert transform filter.

30. The apparatus of claim 29, wherein said tuner is designed for converting the frequencies of said digital television signal to a final intermediate-frequency signal offset from zero frequency by at least a few hundred kilohertz, which facilitates construction of said Hilbert transform filter.

31. The apparatus of claim 28, wherein said circuitry for supplying an imaginary portion as well as a real portion of a complex digitized final intermediate-frequency signal comprises:
first and second infinite-impulse-response filters respectively supplying said real and imaginary portions of said complex digitized final intermediate-frequency as their respective responses to said digitized final intermediate-frequency signal supplied from said analog-to-digital converter.

32. The apparatus of claim 31, wherein said tuner is designed for converting the frequencies of said digital television signal to a final intermediate-frequency signal offset from zero frequency by at least a few hundred kilohertz, which facilitates construction of said first and second infinite-impulse-response filters.

33. The apparatus of claim 28, wherein said circuitry for supplying an imaginary portion as well as a real portion of a complex digitized final intermediate-frequency signal comprises:
first and second finite-impulse-response filters respectively supplying said real and imaginary portions of said complex digitized final intermediate-frequency as their respective responses to said digitized final intermediate-frequency signal supplied from said analog-to-digital converter.

34. The apparatus of claim 33, wherein said tuner is designed for converting the frequencies of said digital television signal to a final intermediate-frequency signal offset from zero frequency by at least a few hundred kilohertz, which facilitates construction of said first and second finite-impulse-response filters.

* * * * *